(12) United States Patent
Asano et al.

(10) Patent No.: US 7,005,688 B2
(45) Date of Patent: Feb. 28, 2006

(54) SEMICONDUCTOR DEVICE WITH IMPURITY LAYER TO PREVENT DEPLETION LAYER EXPANSION

(75) Inventors: Tetsuro Asano, Ora-gun (JP); Mikito Sakakibara, Saitama (JP); Yoshibumi Nakajima, Ashikaga (JP); Hidetoshi Ishihara, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 3 days.

(21) Appl. No.: 10/470,594

(22) Filed: Oct. 14, 2003

(65) Prior Publication Data

US 2004/0211990 A1 Oct. 28, 2004

(30) Foreign Application Priority Data

Oct. 10, 2002 (JP) ............................. 2002-297748

(51) Int. Cl.
*H01L 29/812* (2006.01)
(52) U.S. Cl. .................. 257/280; 257/213; 257/256
(58) Field of Classification Search ............... 257/155, 257/156, 260, 267, 280, 281, 282, 283, 284, 257/449, 450, 453, 454, 455, 456, 471, 472, 257/473, 474, 475, 476, 477, 478, 479, 480, 257/481, 482, 483, 484, 485, 486, 549, 550, 257/652

See application file for complete search history.

(56) References Cited

U.S. PATENT DOCUMENTS 4,607,270 A * 8/1986 Iesaka
5,439,849 A * 8/1995 McBride et al.
6,580,107 B1 * 6/2003 Asano et al.

OTHER PUBLICATIONS

A.O. Adan, M. Fukumi, K. Higashi, T. Suyama, M. Miyamoto, M. Hayashi, Electromagnetic Coupling Effects in RFCMOS Circuits, IEEE Radio Frequency Integrated Circuits Symposium, 2002, IC Development Group, SHARP Corp., Advance Research Labs., SHARP Corp.

* cited by examiner

Primary Examiner—Nathan J. Flynn
Assistant Examiner—Kevin Quinto
(74) Attorney, Agent, or Firm—Morrison & Foerster LLP

(57) ABSTRACT

A semiconductor switching device includes a plurality of metal layers. At least one of the metal layers forming a Schottky junction with a semi-insulating substrate or an insulating layer on a substrate. The device also includes an impurity diffusion region, and a high-concentration impurity region formed between two of the metal layers or between one of the metal layers and the impurity diffusion region so as to suppress expansion of a depletion layer from the corresponding metal layer.

20 Claims, 16 Drawing Sheets

Prior Art

Prior Art

Prior Art

Prior Art

Prior Art

SEMICONDUCTOR DEVICE WITH IMPURITY LAYER TO PREVENT DEPLETION LAYER EXPANSION

BACKGROUND OF THE INVENTION

1. Field of the Invention

The invention relates to a semiconductor device and, in particular, to a semiconductor device which includes a field-effect transistor (hereinafter referred to as a FET) with improved isolation.

2. Description of the Prior Art

Mobile communications equipment such as portable telephones often uses GHz-band microwaves, and their antenna switching circuits and transmitting and receiving switching circuits include switching elements for switching high-frequency signals. As an element thereof, an FET using gallium arsenide (GaAs) is often employed because high frequencies are used. Developments have been made in forming a monolithic microwave integrated circuit (MMIC) by integrating the switching circuits.

Hereinafter, an example of a conventional switch circuit device using GaAs FETs will be described. FIG. 13A shows an example of a theoretical circuit diagram of a compound semiconductor device using GaAs FETs, which is called an SPDT (Single Pole Double Throw). Sources (or drains) of first and second FET1 and FET2 are connected to a common input terminal IN, and gates of the respective FET1 and FET2 are connected to first and second control terminals Ctl-1 and Ctl-2 via resistors R1 and R2, and drain (or sources) of the respective FETs are connected to first and second output terminals OUT-1 and OUT-2. Signals to be applied to the first and second control terminals Ctl-1 and Ctl-2 are complementary signals, and the FET to which an H-level signal has been applied is made to turn ON and transmits the signal applied to the input terminal IN to the corresponding output terminal. The resistors R1 and R2 are arranged for the purpose of preventing high-frequency signals from leaking via the gate electrodes to the DC potential of the control terminals Ctl-1 and Ctl-2 which are AC grounded.

FIG. 13B is a plan view when this compound semiconductor switch circuit device is integrated. As shown in the drawing, the FET1 and FET2 for switching are arranged in the central parts of a GaAs substrate, and the resistors R1 and R2 are connected to gate electrodes of the respective FETs. In addition, pads corresponding to the common input terminal IN, output terminals OUT-1 and OUT-2, and control terminals Ctl-1 and Ctl-2 are provided at the periphery of the substrate. A second-layer wiring indicated by dotted lines is a gate metal layer (Ti/Pt/Au) 68 formed simultaneously with a gate electrode formation of the respective FETs, and a third-layer wiring indicated by solid lines is a pad metal layer (Ti/Pt/Au) 77 for connection of respective elements and a pad formation. An ohmic metal layer (AuGe/Ni/Au), which is the first-layer and in ohmic contact with substrate, forms source electrodes and drain electrodes of the respective FETs, and forms electrodes at both ends of the respective resistors. This layer is not illustrated in FIG. 13 since this overlaps with the pad metal layer.

In locations where the electrode pad and the wiring are adjacent, impurity regions 60 and 61 are provided in contact with the whole lower surface (or a peripheral part) of the electrode pad and wiring. The impurity regions 60 and 61 are provided in a protruding manner from a contact part of the electrode pad or wiring to the substrate and secure a predetermined isolation.

With reference to FIG. 14A through FIG. 17C, an example of a manufacturing method for FETs, wirings and pads connected to respective terminals which are all elements of such a compound semiconductor switch circuit device will be described. Although a description will be herein given of one electrode pad, electrode pads to be connected to the above-described common input terminal, first and second control terminals, and first and second output terminals are all of an identical structure.

First step: The whole surface of a compound semiconductor substrate 51 formed of GaAs or the like is covered with a through ion implanting silicon nitride film 53 having a thickness of approximately 100 Å to 200 Å. Next, GaAs at the outermost or a predetermined region of the chip is etched to form alignment marks (unillustrated), and a photolithography process is performed to selectively open a window in a resist layer 54 above a predetermined operation layer 52. Thereafter, by use of this resist layer 54 as a mask, an ion implantation of impurity ($24Mg^+$) to give a $p^-$-type to select an operation layer and an ion implantation of impurity ($29Si^+$) to give an n-type are performed for the predetermined operation layer 52. As a result, a $p^-$-type region 55 and, an n-type operation layer 52 are formed as a two-layer structure in the non-doped substrate 51 (FIG. 14A).

Second step: The resist layer 54 used in the previous step is removed, and a photolithography process is newly performed to selectively open windows in a resist layer 58 above a predetermined source region 56, drain region 57, a predetermined wiring 62 and electrode pad 70. Subsequently, by use of this resist layer 58 as a mask, an ion implantation of impurity ($29Si^+$) to give an n-type is performed for the substrate surface at the predetermined source region 56, the drain region 57, the predetermined wiring 62 and electrode pad 70. Thereby, an $n^+$-type source region 56 and drain region 57 are formed, and simultaneously, $n^+$-type regions 60 and 61 are formed on the substrate surface under the predetermined electrode pad 70 and wiring 62 (FIG. 14B).

Thereby, the wiring 62, the electrode pad 70 and the substrate 51 are separated, and no depletion layer extends to the electrode pad 70 or wiring 62, therefore, the adjacent electrode pad 70 and wiring 62 can be formed close to each other. It has been determined that setting alienation distance between the electrode pad 70 and the wiring 62 to 4 μm is sufficient to secure a 20 dB or more isolation. In addition, it has also been discovered through an electromagnetic field simulation that the isolation is as high as 40 dB at 2.4 GHz if an approximately 4 μm alienation distance is provided. Thereafter, an silicon nitride film 53 for annealing is deposited at approximately 500 Å, and activation annealing for the ion implanted $p^-$-type region, n-type operation layer and $n^+$-type regions is performed.

Third step: First, a photolithography process is performed to selectively open windows at parts to form a predetermined first source electrode 65 and first drain electrode 66. The silicon nitride film 53 positioned at the predetermined first source electrode 65 and first drain electrode 66 is removed by $CF_4$ plasma, and subsequently, three layers of AuGe/Ni/Au to become an ohmic metal layer 64 are evaporated in this order. Thereafter, a resist layer 63 is removed by lift-off to leave the first source electrode 65 and first drain 66 on the source region 56 and drain region 57. Subsequently, ohmic junctions between the first source electrode 65 and source region 56 and the first drain electrode 66 and drain region 57 are formed by alloying process. (FIG. 15).

Fourth step: in FIG. 16A, a photolithography process is performed to selectively open windows at predetermined gate electrode 69, electrode pad 70, and wiring 62 parts. The silicon nitride film 53 exposed through the predetermined gate electrode 69, electrode pad 70, and wiring 62 parts is dry-etched to expose the operation layer 52 in the predetermined gate electrode 69 part and to expose the substrate 51 in the predetermined wiring 62 and predetermined electrode pad 70 parts.

An opening part of the predetermined gate electrode 69 part is provided as 0.5 μm so that a miniaturized gate electrode 69 can be formed. At this time, as described in the second step, since the nitride film under the electrode pad 70, which had conventionally been necessary to secure isolation, can be removed as a result of a provision of the $n^+$-type regions 60 and 61, cracking of the nitride film and substrate due to an impact when a bonding wire is press-bonded is eliminated.

Next, as shown in FIG. 16B, three layers of Ti/Pt/Au are evaporated in order as a gate metal layer 68. Thereafter, a gate electrode 69, a first electrode pad 70, and wiring 62 are formed by lift-off (FIG. 16C).

Fifth step: After forming the gate electrode 69, wiring 62, and first electrode pad 70, in order to protect the operation layer 52 around the gate electrode 69, the surface of the substrate 51 is covered with a passivation film 72 made of a silicon nitride film. A photolithography process is performed on this passivation film 72 to selectively open windows in a resist for contact parts with the first source electrode 65, first drain electrode 66, gate electrode 69, and first electrode pad 70, and the passivation film 72 in these parts is dry-etched. Thereafter, the resist layer 71 is removed (FIG. 17A).

Next, a new resist layer 73 is applied to the whole surface of the substrate 51 for a photolithography process, and a photolithography process is performed to selectively open windows in the resist on a predetermined second source electrode 75, a second drain electrode 76, and a second electrode pad 77. Subsequently, three layers of Ti/Pt/Au to become a pad metal layer 74 as a third-layer electrode are evaporated in this order, whereby a second source electrode 75 and second drain electrode 76 and a second electrode pad 77, which are in contact with the first source electrode 65, first drain electrode 66, and first electrode pad 70, are formed (FIG. 17B). Since the other parts of the pad metal layer 74 are adhered onto the resist layer 73, the resist layer 73 is removed to leave only the second source electrode 75, second drain electrode 76, and second electrode pad 77 by lift-off, while the other parts are removed. Herein, since some wiring parts are formed by use of this pad metal layer 74, as a matter of course, the pad metal layer 74 of these wiring parts are left (FIG. 17C).

Furthermore, in FIG. 18 and FIG. 19, shown is a switch circuit device provided with shunt FETs for improving isolation. FIG. 18 is a circuit diagram, and FIG. 19 is a chip plan view.

In this circuit, shunt FET3 and FET4 are connected between the output terminal OUT-1 and OUT-2 of the FET1 and FET2 for switching and ground. To gates of these shunt FET3 and FET4, complementary signals of the control terminals Ctl-2 and Ctl-1 to the FET2 and FET1 are applied. As a result, when the FET1 is on, the shunt FET4 is on, and the FET2 and shunt FET3 are off.

In this circuit, when the signal path from the common input terminal IN to the output terminal OUT-1 is turned on and the signal path from the common input terminal IN to the output terminal OUT-2 is turned off, leakage of input signals to the output terminal OUT-2 is, since the shunt FET4 is on, released to the ground via a grounded capacitor C, thus isolation can be improved.

FIG. 19 shows an example of a compound semiconductor chip where such a compound semiconductor switch circuit device has been integrated.

The FET1 and FET2 for switching are arranged in the left and right central parts of a GaAs substrate 11, and the shunt FET3 and shunt FET4 are arranged in the vicinities of the left and right lower corners, and the resistors R1, R2, R3, and R4 are connected to gate electrodes 17 of the respective FETs. In addition, pads I, O1, O2, C1, C2, and G corresponding to the common input terminal IN, output terminals OUT-1 and OUT-2, control terminals Ctl-1 and Ctl-2, and ground terminal GND are provided at the periphery of the substrate. The FET1 and FET2 for switching are provided, and furthermore, source electrodes of the shunt FET3 and shunt FET4 are connected and, via a capacitor C for grounding, connected to the ground terminal GND. Moreover, second-layer wiring as shown by dotted lines is a gate metal layer 20 (Ti/Pt/Au) formed simultaneously with a gate electrode formation of the respective FETs, and third-layer wiring shown by solid lines is a pad metal layer 30 (Ti/Pt/Au) for connection of respective elements and a pad formation. An ohmic metal layer (AuGe/Ni/Au), which is in ohmic contact with the first-layer substrate, forms source electrodes and drain electrodes of the respective FETs, and forms electrodes at both ends of the respective resistors, and is not illustrated in FIG. 19 since this overlaps with the pad metal layer.

Japanese Patent Application Publication No. 2001-326501 provides the following description on a similar device.

In recent years, wireless broadband in a 2.4 GHz-band has shown a great expansion. Its transmitting rate is 11 Mbps, which is much greater than the transmitting rate of mobile telephones, and has gained popularity in ordinary households, for example, ADSL over telephone lines provides wireless service throughout an entire household, or where signals are wirelessly distributed to a cordless liquid crystal television. Recently, a 5 GHz-band has received a special attention as a next-generation wireless broadband, and furthermore, it is anticipated that its outdoor use will soon be approved as a result of revised legislation and its range of application will be greatly expanded. Compared to the 2.4 GHz band, since the 5 GHz band enables transmitting a larger amount of information at a transmission rate of 54 Mbps, there is great expectation for sending high-precision moving images without compression, etc., and development of apparatuses and construction of networks for that purpose have been eagerly carried out.

In 5 GHz-band broadband apparatuses, similar to those with a 2.4 GHz band, GaAs switch ICs are used for input/output switching and antenna switching. Since the frequency is twice that of 2.4 GHz, parasitic capacitance greatly influences deterioration in isolation. Thus, designs for improving isolation has became indispensable, such as, in a circuit using shunt FETs which have not been used in a 2.4 GHz-band switch IC, for releasing signals leaked to its OFF-side FET to its GND.

Namely, in a 5 GHz switch, it is indispensable to provide shunt FETs for an isolation improvement as shown in FIG. 18 and FIG. 19. However, provision thereof results in a great increase in chip size. In particular, when consideration is given to arranging FET3 and FET4 as shunt FETs below FET1 and FET2 of a switch circuit device of FIG. 13B, it is necessary to provide an alienation distance of 20 μm or more between the FET1 and FET2 for a switching operation and FET3 and FET4 as shunt FETs in order to secure isolation. This is because isolation must be secured between a front end part of the gate electrode 69 arranged on the operation layer of an FET and adjacent other FETs, wiring, electrode pads, and resistors as impurity regions. Herein, the front end part 69a of a gate electrode means a side opposite to where a comb-teeth-formed gate electrode 69 is bound, and this is a region where the gate electrode 69 is extended from the channel region and forms a Schottky junction with the substrate.

When high-frequency signals are applied to the wiring and electrode pad of a metal layer to form a Schottky junction with the substrate, the electric field of a depletion layer expanding in the substrate fluctuates according to the high-frequency signals. In order to prevent the high-frequency signals from leaking to an adjacent electrode and wiring at which this depletion layer arrives, for example, an electrode pad 70 part and wiring 62 are formed simultaneously with the gate electrode 69, and $n^+$-type regions 60 and 61 are arranged in contact with the lower side of the gate electrode 68 to form a Schottky junction with the substrate and in a manner exposed from the gate metal layer 68. Thereby, expansion of the depletion layer is suppressed at the $n^+$-type regions 60 and 61 having a Schottky junction with the gate metal layer 68, whereby the high-frequency signals are prevented from leaking.

However, at the front end part 69a of the gate electrode 69 arranged on the operation layer of a FET, this method cannot be used for an improvement in isolation from adjacent other FETs, other gate metal layers 68, and impurity regions to form resistors or other FETs. Although the front end part 69a of the gate electrode 69 is arranged on the semiconductor substrate, to arrange the $n^+$-type regions 60 and 61 thereunder, the $n^+$-type regions 60 and 61 require a pattern size of several μm or more because of a mask alignment error between the gate electrode 69 and $n^+$-type regions 60 and 61 and for the reason that the $n^+$-type regions 60 and 61 have not been formed by a fine photolithography process. Therefore, the $n^+$-type regions 60 and 61 arranged under the adjacent gate electrode front end parts 69a come into contact with each other, and parasitic capacitance occurs between the $n^+$-type regions 60 and 61 and the source electrode and drain electrode on the channel region of an adjacent FET. Thereby, high-frequency signals leakage between the source to drain regions via the $n^+$-type regions 60 and 61, and this results in, if the FETs are used in a switch circuit device, a signal leakage between the input and output terminals at OFF. Therefore, there existed a problem of a deterioration in isolation of the switch circuit device.

For example, in FIG. 19, it has been necessary to secure a distance 20 μm or more between the front end part 69a of the gate electrode of the FET1 and OUT-1 pad and between the front end part 69a of the gate electrode of the FET2 and OUT-2 pad.

SUMMARY OF THE INVENTION

The invention provides a semiconductor device that includes a plurality of metal layers. At least one of the metal layers forms a Schottky junction with a semi-insulating substrate or an insulating layer on a substrate. The device also includes an impurity diffusion region and a high-concentration impurity region formed between two of the metal layers or between one of the metal layers and the impurity diffusion region so as to suppress expansion of a depletion layer from the corresponding metal layer.

The invention also provides a semiconductor device that includes a plurality of field effect transistors. Each of the transistors includes a channel region, a source and a drain electrodes which form an ohmic junction with the channel region and a gate electrode forming a Schottky junction with the channel region and a semi-insulating substrate or an insulating layer. The device also includes a high-concentration impurity region formed between a gate electrode of one of the transistors and another of the transistors so as to suppress expansion of a depletion layer from the gate electrode.

The invention further provides a semiconductor device that includes a plurality of field effect transistors. Each of the transistors includes a channel region, a source and a drain electrodes which form an ohmic junction with the channel region and a gate electrode forming a Schottky junction with the channel region and a semi-insulating substrate or an insulating layer on a substrate. The device also includes a metal layer forming a Schottky junction with the semi-insulating substrate or the insulating layer and comprising a electrode pad and a metal wiring layer, an impurity diffusion region connecting the transistors and the metal wiring layer, and a high-concentration impurity region formed between a gate electrode of one of the transistors and the metal layer or between the gate electrode and the impurity diffusion region so as to suppress expansion of a depletion layer from the gate electrode.

The invention further provides a semiconductor device that includes a plurality of field effect transistors. Each of the transistors includes a channel region, a source and a drain electrodes which form an ohmic junction with the channel region and a gate electrode forming a Schottky junction with the channel region and a semi-insulating substrate or an insulating layer on a substrate. The device also includes a plurality of metal layers. At least one of the metal layers forms a Schottky junction with the semi-insulating substrate or the insulating layer and includes a electrode pad and a metal wiring layer. The device also includes an impurity diffusion region connecting the transistors and the metal wiring layer, and a high-concentration impurity region formed between one of the metal layers and one of the transistors, between two of the metal layers or between one of the metal layers and the impurity diffusion region so as to suppress expansion of a depletion layer from the metal layer.

DESCRIPTION OF THE INVENTION

Figure 1A:
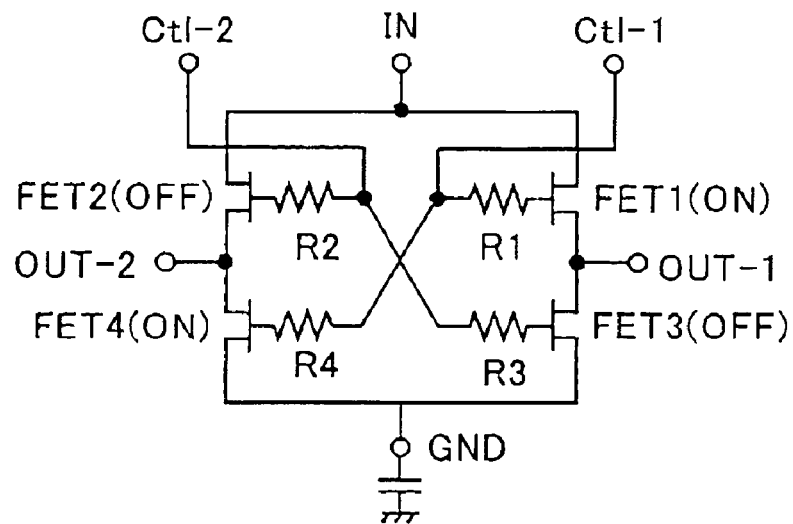
FIGS. 1A and 1B are circuit diagrams of embodiments of the invention.
Figure 1B:
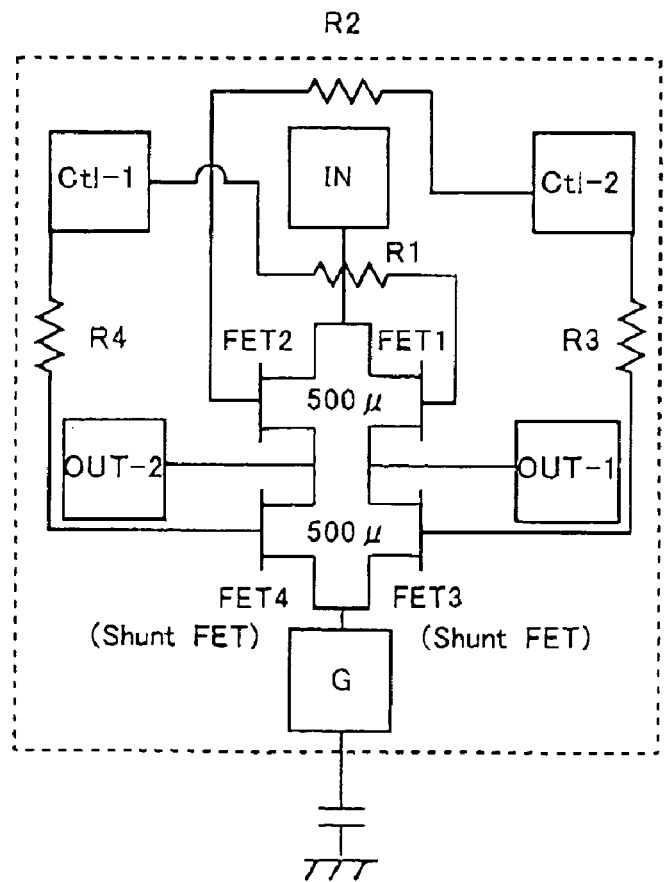

First, a first embodiment of the invention will be described. FIGS. 1A and 1B are circuit diagrams for explaining a switch circuit device of the embodiment, wherein FIG. 1A is an equivalent circuit diagram, and FIG. 1B is a schematic circuit pattern diagram.

In this circuit, shunt FET3 and FET4 are connected between the output terminals OUT-1 and OUT-2 of the FET1 and FET2 for switching and ground. To gates of these shunt FET3 and FET4, complementary signals of the control terminals Ctl-2 and Ctl-1 to the FET2 and FET1 are applied. As a result, when the FET1 is on, the shunt FET4 is on, and the FET2 and shunt FET3 are off.

In this circuit, when the signal path from the common input terminal IN to the output terminal OUT-1 is turned on and the signal path from the common input terminal IN to the output terminal OUT-2 is turned off, an input signal leakage to the output terminal OUT-2 is, since the shunt FET4 is on, released to the ground via a grounded capacitor C, thus isolation can be improved.

Figure 2:
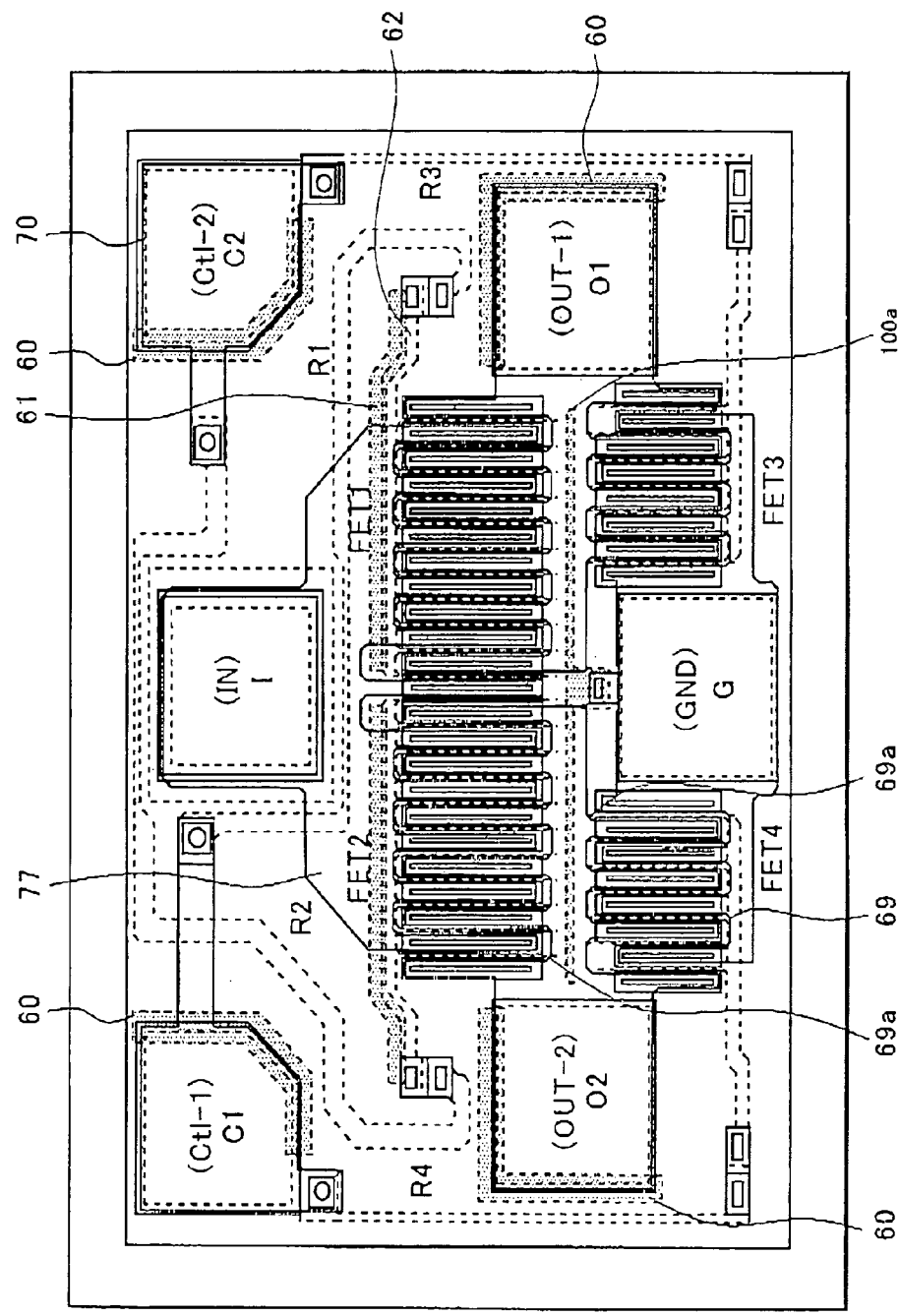
FIG. 2 is a plan view of a semiconductor device of a first embodiment of the invention.

FIG. 2 is a plan view showing an example of a compound semiconductor switch circuit device where the switch circuit device of FIG. 1 is integrated.

The substrate is a compound semiconductor substrate (GaAs, for example). The FET1 and FET2 (both have a gate width of 600 $\mu$m) for switching are arranged on the left and the right on the substrate. Shunt FET3 and shunt FET4 (both have a gate width of 300 $\mu$m) are arranged at lower parts thereof, and the resistors R1, R2, R3, and R4 are connected to gate electrodes of the respective FETs. In addition, electrode pads I, O1, O2, C1, C2, and G corresponding to the common input terminal IN, output terminals OUT-1 and OUT-2, control terminals Ctl-1 and Ctl-2, and ground terminal GND are provided at the periphery of the substrate. The FET1 and FET2 for switching are provided. Source electrodes of the shunt FET3 and shunt FET4 are connected to each other and connected to the ground terminal GND. Although illustration is herein omitted, a capacitor C for grounding is externally connected to the ground terminal GND. Moreover, second-layer wiring as shown by dotted lines is a gate metal layer 68 (Ti/Pt/Au) formed simultaneously with gate electrode formation of the respective FETs, and third-layer wiring indicated by solid lines is a pad metal layer 77 (Ti/Pt/Au) for connection of respective elements and forms electrode pads. An ohmic metal layer (AuGe/Ni/Au), which is in ohmic contact with the first-layer substrate, forms source electrodes and drain electrodes of the respective FETs, and forms electrodes at both ends of the respective resistors, and is not illustrated in FIG. 2 since this overlaps with the pad metal layer.

In FIG. 2, for the FET1 (the same applies to the FET2 as well), six-comb-teeth-formed third-layer pad metal layer 77 extending from the lower side is a source electrode 75 (or a drain electrode) to be connected to the output terminal OUT-1, and thereunder, a source electrode 65 (or a drain electrode) formed of a first-layer ohmic metal layer exists. In addition, six-comb-teeth-formed third-layer pad metal layer 77 extending from the upper side is a drain electrode 76 (or a source electrode) to be connected to the common input terminal IN, and thereunder, a drain electrode 66 (or a source electrode) formed of a first-layer ohmic metal layer exists. These both electrodes are arranged in a shape of engaged comb teeth, and a gate electrode 69 formed of a second-layer gate metal layer 68 is arranged therebetween in a comb teeth shape, whereby an FET channel region is constructed.

In addition, for the FET3 as a shunt FET (the same applies to the FET4), four-comb teeth-formed third-layer pad metal layer 77 extending from the lower side is a source electrode 75 (or a drain electrode) to be connected to the ground terminal, and thereunder, a source electrode 65 (or a drain electrode) formed of a first-layer ohmic metal layer exists. In addition, four-comb teeth-formed third-layer pad metal layer 77 extending from the upper side is a drain electrode 76 (or a source electrode) to be connected to the output terminal OUT-1, and thereunder, a drain electrode 66 (or a source electrode) formed of a first-layer ohmic metal layer exists. These both electrodes are arranged in a shape of engaged comb teeth, and a gate electrode 69 formed of a second-layer gate metal layer 68 is arranged therebetween in a comb teeth shape, whereby an FET channel region is constructed.

Furthermore, on the substrate surface in the vicinity of the gate electrodes 69 of the respective FETs, an $n^+$-type high-concentration impurity region 100a is provided. In detail, this is a part where the front end part 69a of the comb-teeth-formed gate electrode 69 of the FET1 and the front end part 69a of the comb-teeth-formed gate electrode 69 of the FET2 are at least adjacent to the opposed FET3 and FET4. Herein, the front end part 69a of the gate electrode means the side opposite the base side of the comb structure, and this is a region where the gate electrode 69 is extended from the channel region and forms a Schottky junction with the substrate. A high-concentration impurity region 100a is arranged at an alienation distance of 4 $\mu$m from the respective gate electrode front end part 69a.

In addition, the high-concentration impurity region 100a is also arranged at an alienation distance of 4 $\mu$m from the gate electrode front end part 69a of the FET3 and the gate electrode front end part 69a of the FET4 opposed to the FET1 and FET2. Namely, in the embodiment's pattern, the high-concentration impurity region 100a is arranged between the FET1 and FET2 for switching operation and FET3 and FET4 as opposed shunt FETs.

By this high-concentration impurity region 100a, expansion of a depletion layer that extends from the gate electrode 69 to form a Schottky junction with the substrate to the substrate can be suppressed. At the metal layer to form a Schottky junction with the substrate, the electric field of the depletion layer that expands to the substrate fluctuates depending on high-frequency signals transmitted by the metal layer, therefore, the high-frequency signals may leak to adjacent electrodes, etc., at which the depletion layer arrives.

However, if the $n^+$-type high-concentration impurity region 100a is provided on the surface of the substrate 51 between the FET1 and FET3 and between FET2 and FET4 arranged so that the gate electrodes 69 are adjacent, unlike the surface (although this is semi-insulating, the substrate resistance value is $1 \times 10^7$–$1 \times 10^8$ $\Omega$·cm) of the substrate 51 where no impurity has been doped, the impurity concentration becomes high (ion type is 29Si$^+$ and the concentration is 1–$5 \times 10^{18}$ cm$^{-3}$). Thereby, the gate electrodes 69 of the respective FETs are separated, and no depletion layer extends to adjacent FETs (impurity regions of the source regions, drain regions, and channel region and gate electrodes), therefore, the adjacent FETs can be provided with a greatly approximated alienation distance from each other.

As described above, since the gate electrodes 69 can be formed with a fine pattern, in the embodiment, the high-concentration impurity region 100a is arranged at several micrometers of alienation distance from the gate electrodes 69 to form a Schottky junction with the substrate. By providing the high-concentration region 100a as such, the depletion layer, which expands from the gate electrodes of the FET1 and FET2 to the substrate, is prevented from arriving at the gate electrodes, source regions, drain regions, and channel regions of the opposed FET3 and FET4 arranged in an adjacent manner, whereby leakage of high-frequency signals is suppressed.

In detail, setting alienation distance from the front end part 69a of the gate electrode 69 to the high-concentration region 100a to 4 μm is sufficient to secure a predetermined isolation.

Figure 3A:
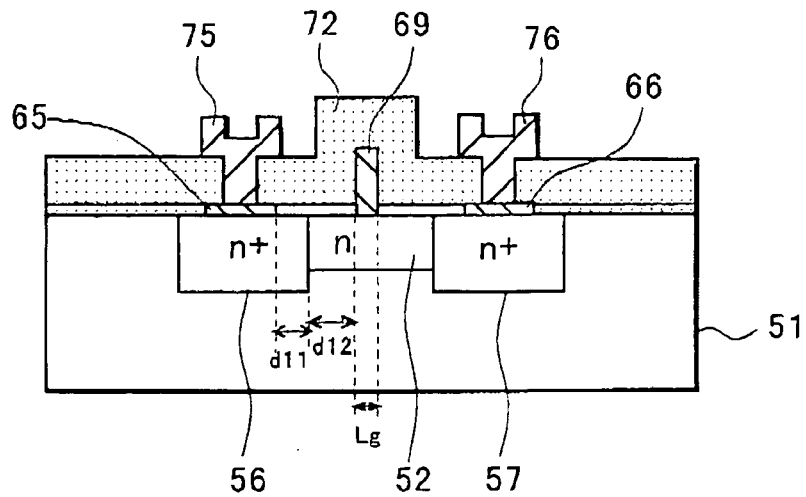
FIG. 3A is a sectional view of the device of FIG. 2.

FIG. 3 shows a sectional diagram of a part of an FET of the switch circuit of FIG. 1. Herein, the FET1 and FET2 for switching operation and the FET3 and FET4 as shunt FETs all have substantially an identical construction.

As in FIG. 3, on the substrate 51, an operation layer 52, which is an n-type ion implanted layer, and on both sides thereof $n^+$-type impurity regions to form a source region 56 and a drain region 57 are provided. On the operation layer 52, a gate electrode 69 is provided, and on the impurity regions, a drain electrode 66 and a source electrode 65 formed of the first-layer ohmic metal layer are provided. Further thereon, provided are a drain electrode 76 and a source electrode 75 formed of the third-layer pad metal layer 77 as described above, whereby wiring for the respective elements is carried out.

Herein, a description will be given of a high-concentration impurity region 100a. Impurity concentration of the high-concentration impurity region 100a is $1\times10^{17}$ cm$^{-3}$ or more. Moreover, if a part thereof connects with a metal electrode 200 and the metal electrode 200 is connected to a high-frequency GND potential electrode pad 70, this is more effective for an improvement in isolation.

Figure 3B:
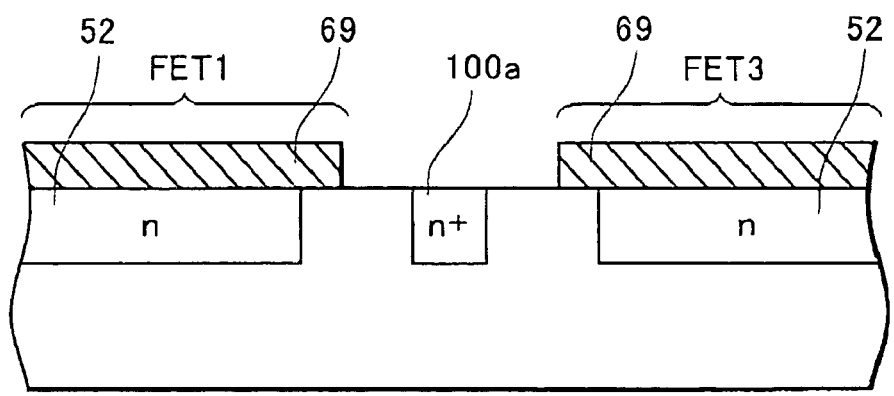
FIG. 3B is another sectional view of the semiconductor device of FIG. 2

FIG. 3B schematically shows a sectional view of the high-concentration impurity region 100a located between FET1 and FET3. The edge of the comb of the gate electrodes 69 of the FET extends from the operation layer 52 and reaches the semi-insulating substrate 51 to form a Schottky junction. The high-impurity region 100a separated from the FET gate edge by a few μm prevents the extension of a depletion layer from one FET to another FET.

Figure 3C:
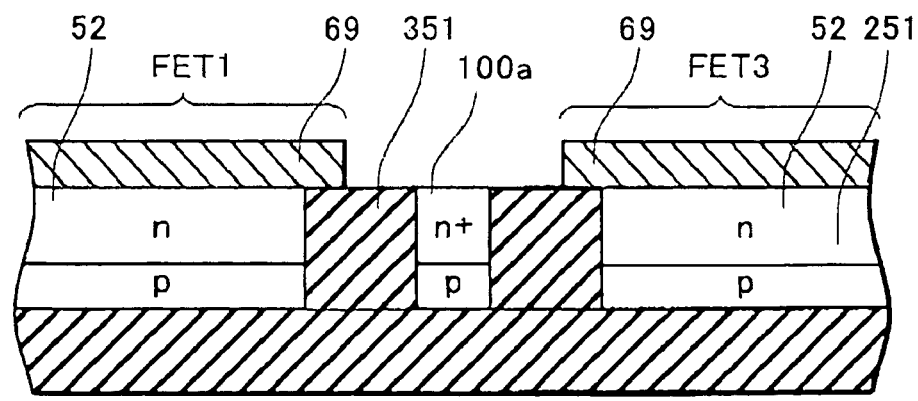
FIG. 3C is a sectional view of a semiconductor device with modification to the device of FIG. 2.

As a modification of this embodiment, a semiconductor substrate with an insulating layer may be used in place of the semi-insulating substrate, and the gate electrode 69 may form a Schottky junction with this insulating layer, as shown in FIG. 3C. FET1 and FET3 are formed on a silicon substrate 251. An insulating layer 351 is formed in the substrate 251, which is a p-type substrate, by impurity ion implantation to separate the two FETs electrically. Each of the FETs includes the operation layer 52 formed on the p-type substrate 251 and the gate electrode 69. The edge of the comb of the gate electrodes 69 of the FET shown in the figure extends from the operation layer 52 and reaches the insulating layer 351 to form a Schottky junction. The high-impurity region 100a separated from the FET gate edge by a few μm prevents the extension of a depletion layer from one FET to another FET, as is the case with the device of FIG. 3B. The resistivity of the insulating layer 351 is $1\times10^3$ Ω·cm.

FIGS. 4A–4E show a relationship between the high-concentration impurity region 100a and metal electrode 200.

Figure 4A:
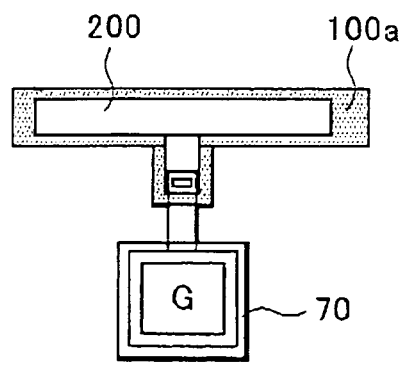
FIGS. 4A–4E are plan views for of the device of the first embodiment.

First, in FIG. 4A, the high-concentration 100a is in ohmic contact with the metal electrode 200, and the metal electrode 200 is connected to the high-frequency GND pad 70. This pattern is most effective in leading signals leaked to the high-concentration impurity region 100a out into the high-frequency GND pad 70, and is thus most effective in improving isolation. However, in an ohmic junction, the metal electrode is often diffused deeply into the substrate. If the metal electrode of the ohmic junction pass through the depth of the high-concentration impurity region, this results in a contact between the semi-insulating region of the substrate and the metal electrodes. Accordingly, in such a case, isolation is adversely deteriorated, and an ohmic contact cannot be used. Herein, the pattern shown in FIG. 2 is provided with this metal electrode 200 in ohmic contact.

Figure 4D:
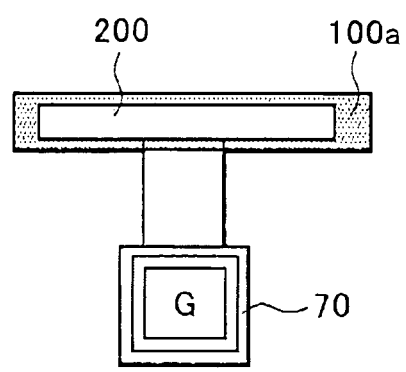
Figure 4B:
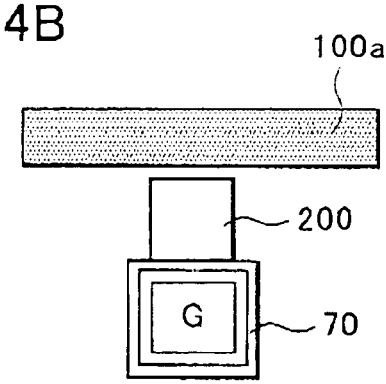
Figure 4E:
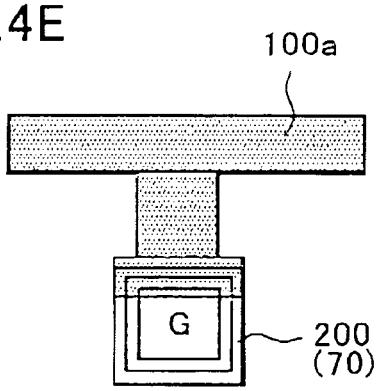
Figure 4C:
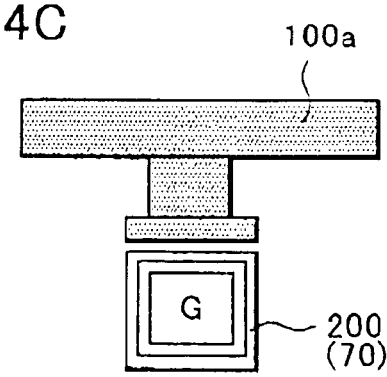

In FIGS. 4B and 4C, a high-concentration impurity region 100a is connected to a metal electrode 200 via a semi-insulating substrate 51, and the metal electrode 200 forms a Schottky junction with the semi-insulating substrate 51, and the metal electrode 200 is connected to the high-frequency GND pad 70. In FIG. 4B, the metal electrode 200 is provided on the surface of the substrate 51. In consideration of mask alignment accuracy, the metal electrode 200 is provided at a distance of 0–10 μm from the end part of the high-frequency impurity region 100a. If it is distant more than 10 μm, series resistance becomes great and signals leaked to the high-concentration impurity region 100a cannot be easily sucked out into the high-frequency GND pad 70. In FIG. 4C, the pattern of a high-concentration impurity region 100a is deformed for an arrangement in the vicinity of the high-frequency GND pad 70. In FIG. 4C, the metal electrode 200 is a part of the electrode pad 70. Other wiring, etc., is arranged around the high-frequency GND pad 70, and this pattern is effective in such a case as in FIG. 4B where the metal electrode cannot be extended from the high-frequency GND pad 70, however, this has a great series resistance and a slightly low isolation effect compared to FIG. 4B.

Furthermore, in FIGS. 4D and 4E, a metal electrode 200 is brought into contact with at least a part of the high-concentration impurity region 100a and forms Schottky contact with the region. And the metal electrode 200 is connected to the high-frequency GND pad 70 and are small in series resistance and great in isolation effect compared to FIGS. 4B and 4C. As in FIG. 4D, the metal electrode 200 may be extended to be connected to the electrode pad 70, and as in FIG. 4E, a high-concentration impurity region 100a pattern may be deformed so that a part of the electrode pad 70 becomes a metal electrode 200.

A high-frequency GND pad means grounding as a high frequency, and this describes grounding via an external capacitance from a high-frequency GND pad. Effects are the same as those by a GND potential pad or a DC potential in place of the high-frequency GND pad.

In this embodiment, in a region where the gate electrodes 69 of the FET1 and FET2 to form a Schottky junction with the substrate are at least adjacent to the FET3 and FET4 as opposed shunt FETs, the high-concentration impurity region 100a is provided in the vicinity of the gate electrode front end parts 69a. Thereby, expansion of a depletion layer, which extends from the gate electrodes 69 of the FET1 and FET2 to the substrate, can be suppressed, therefore, the FET1 and FET2 and the FET3 and FET4 can be arranged in a manner approximated to a distance at which predetermined isolation can be secured. In detail, if the distance between the high-concentration impurity region 100a and the gate electrodes 69 of the respective FETs is provided as approximately 4 μm, expansion of the depletion layer can be effectively suppressed without leaking necessary signals to the GND due to an interference with the impurity region 100a to be a high-frequency GND itself, and the width of the high-concentration impurity region 100a is sufficient at 2 μm to exhibit the effects, therefore, when the high-concentration impurity region 100a is interposed, the distance between FETs can be as small as approximately 10 m. Thus, the alienation distance between the adjacent FETs, which have conventionally needed a distance of 20 μm or more, can be greatly reduced.

Next, a second embodiment of the invention will be described by use of FIG. 5 through FIG. 12. In the second embodiment, a high-concentration region 100a is arranged between FET1 and FET2 for switching operation and FET3 and FET4 as opposed shunt FETs arranged in an adjacent manner so as to improve isolation between the respective FETs, and furthermore, high-concentration regions 100b are arranged in the vicinity of an electrode pad 70 and wiring 62 of a gate metal layer 68 to form a Schottky junction with the substrate, and moreover, high-concentration regions 100c are arranged in regions where one FET gate electrode is adjacent to the electrode pad and wiring 62 of the gate metal layer 68. Thereby, leakage of high-frequency signals due to a depletion layer which extends from the gate electrode 69, electrode pad 70, and wiring 62 to form a Schottky junction with the substrate to the substrate can be suppressed. In a plan view, components other than the high-frequency impurity regions 100b and 100c provided in the vicinity of the gate metal layer 68 are identical to those shown in FIG. 2. In addition, since its circuit diagram is also identical to that of FIG. 1, description thereof will be omitted.

Figure 5:
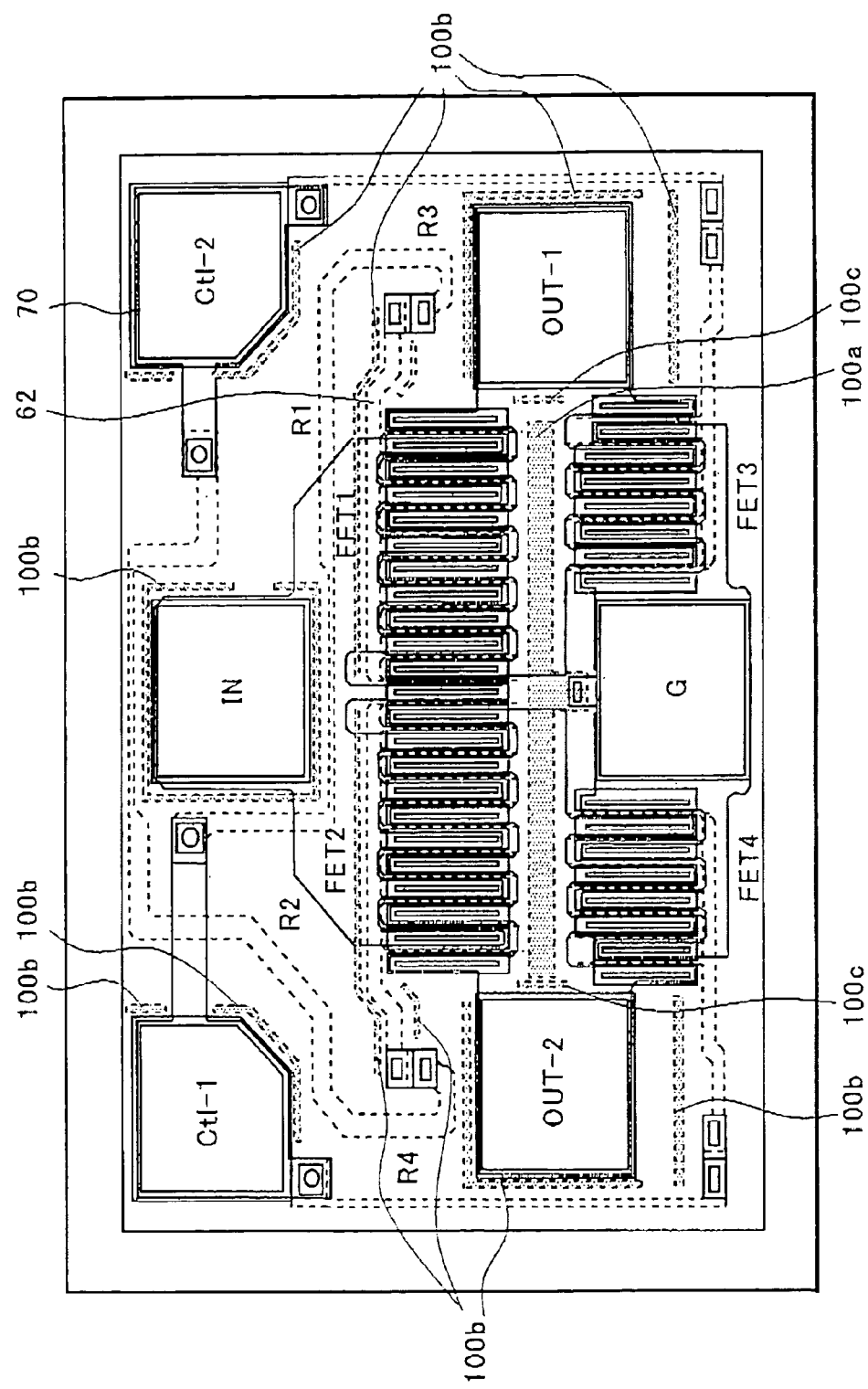
FIG. 5 is a plan view of a semiconductor device of a second embodiment of the invention.
Figure 6:
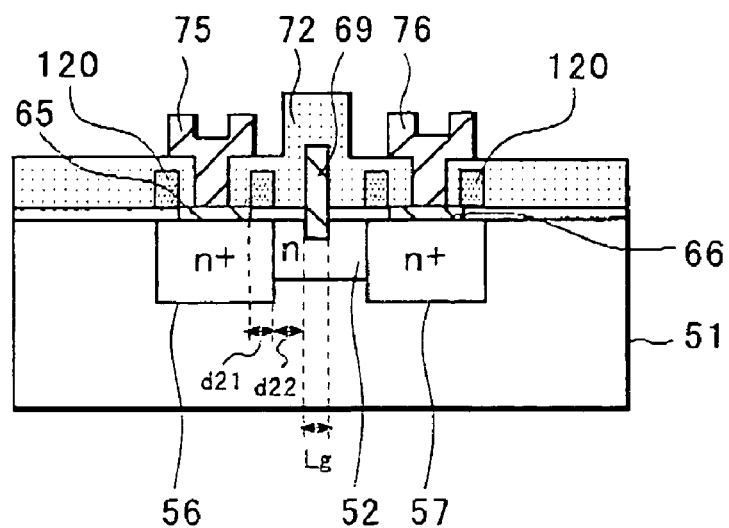
FIG. 6 is a sectional view of the device of FIG. 5.

FIG. 6 shows a sectional view of a part of an FET of the switch circuit device of FIG. 5. Herein, the FET1 and FET2 for switching operation and the FET3 and FET4 as shunt FETs all have an identical construction.

As in FIG. 6, on the substrate 51, an operation layer 52, which is an n-type ion implanted layer, and on both sides thereof n$^+$-type impurity regions to form a source region 56 and a drain region 57 are provided, and on the operation layer 52, a gate electrode 69 is provided, and on the impurity regions, a drain electrode 66 and a source electrode 65 formed of the first-layer ohmic metal layer are provided. Further thereon, provided are a drain electrode 76 and a source electrode 75 formed of the third-layer pad metal layer 77 as described above, whereby wiring for the respective elements is carried out. A difference from the FET of the first embodiment as shown in FIG. 3 exists, first, in that a Pt buried gate is provided to increase the saturation current value of the FET and to decrease the ON resistance value in contrast to the FET of the first embodiment forming, by Ti, a Schottky junction with the channel region. Next, a difference exists in that, on a nitride film to cover the circumference of a drain electrode 66 and a source electrode 65, oxide films 120 are provided along the drain electrode 66 and source electrode 65.

These oxide films 120, which will be described later, are required in a step for manufacturing FETs of the embodiment, and in order to improve mask alignment accuracy of the gate electrode 69, these are formed on the n$^+$-type regions to form a source region 56 and a drain region 57 of a FET. In terms of each oxide film 120, which is formed double along the source region 65 and drain region 66 by its manufacturing method, one side face is almost coincident with the end part of the source region 56 or drain region 57, and the other side face is almost coincident with the end part of the source electrode 65 or drain electrode 66. By providing these oxide films 120, mask alignment accuracy is improved and the distances shown in the figure, d21 and d22, are reduced compared to the conventional values. That is, the distance between the source-to-drain regions and the distance between the source-to-drain electrodes are shortened, and furthermore, the satiation current value of the FET is increased, and the ON resistance value is decreased.

Herein, a gate length Lg means the length of a gate electrode 69 which exists in a channel region 44 (operation layer 52) between the source region 56 and drain region 57, and this is usually 0.5 μm to produce no short-channel effect. A gate width Wg means the width (the sum total of the comb tooth) of the gate electrode 69 that exists in the channel region 44 (operation layer 52) along the source region 56 and drain region 57, and in the embodiment, the gate width Wg of the FET for switching operation, which was 600 μm in the first embodiment, is shrunk to 500 μm, and the gate width Wg of the shunt FET is 300 μm, which is the same as that of the first embodiment.

Thus, reduction in the OFF capacitance of FETs by reducing the gate width Wg of the FETs themselves also provides a great effect to improve isolation. However, in general, a reduction in the gate width Wg of the FETs from 600 μm to 500 μm causes a decrease in the saturation current value, resulting in an increase in the ON resistance value. Therefore, in order to maintain the conventional saturation current value and ON resistance value even after a reduction in the gate width Wg, it is necessary to improve the FETs as basic elements in performance. In the embodiment, an FET includes a gate electrode with buried Pt. Conventionally, though, Ti has been used for this purpose.

The gate electrode 69 is a multi-layer deposited metal layer of, from its undermost layer, Pt/Mo/Ti/Pt/Au and has an electrode structure where a part of the Pt layer has been buried. After heat treatment for burying, the part where Pt was originally existed on the lower most layer mostly becomes PtGa, and the part where Pt has been diffused in GaAs mostly becomes PtAs$_2$.

As a metal to form a Schottky junction with an active region of an GaAs FET, since Pt is higher in the barrier height to GaAs than Ti, a high saturation current value and a low ON resistance value are obtained in a Pt buried gate FET compared to a conventional FET that forms a Schottky junction by Ti. Furthermore, in a Pt buried gate FET, by burying a part of the gate electrode in the channel region, the part where current flows immediately under the gate electrode is lowered from the surface of the channel region. Namely, since the active region has been formed deep beforehand in consideration of a to-be-buried part of the gate electrode so that desirable FET characteristics are obtained, the active region is designed so that, apart from a natural-surface depletion layer region, current flows through a low resistance region of satisfactory crystals. For the above region as well, the Pt buried gate FET is greatly improved in the ON resistance value and high-frequency strain characteristics compared to the Ti gate FET.

Furthermore, compared to the first embodiment, FETs of the embodiment are reduced in distance between the source and drain by improving mask alignment accuracy and devising manufacturing processes, and thus are further improved in characteristics as basic elements. However, for that purpose, oxide films 120 for mask alignment are simultaneously formed on the n$^+$-type regions to be a source region 56 and a drain region 57, and a gate electrode 69 is formed by burying the Pt layer. Accordingly, although this will be described later in detail, the n$^+$-type regions 60 and 61 which are brought into contact with the electrode pad 70 and wiring 62 as shown in the first embodiment cannot be formed.

Therefore, in order to suppress expansion of a depletion layer that extends from the gate metal layer 68 to be one electrode pad 70 and wiring 62 on a chip to the substrate, at a part where this gate metal layer 68 and any of FETs, other gate metal layer 68 (other wiring 62 and other electrode pad 70), and the resistors R1–R4 formed of impurity diffused regions are at least adjacent or a part where the gate electrode of one FET, gate metal layer 68, and resistors R1–R4 are at least adjacent, the high-concentration impurity regions 100b and 100c are provided. The alienation distance from the gate metal layer 68 is approximately 4 μm.

Herein, the high-concentration impurity regions 100a–100c are differentiated as symbols only for clarifying the positions where the same are arranged, and in the embodiment, these components are completely identical in terms of the effect to improve isolation. Namely, similar to the high-frequency impurity region 100a, impurity concentration of the high-concentration impurity regions 100b and 100c is $1 \times 10^{17}$ cm$^{-3}$ or more. In addition, although illustration is omitted, connecting metal electrodes to these high-concentration impurity regions 100b and 100c and connecting the metal electrodes to the GND is effective in improvement in isolation.

In this case, the method for connecting the high-concentration impurity regions 100b and 100c to the metal electrodes is the same as shown in FIG. 4, therefore, a description thereof will be omitted. In addition, if an arrangement on the chip is possible, by connecting, to this metal electrode 200, an electrode pad to which a GND potential or a DC potential is applied or by utilizing a part thereof as a metal electrode, isolation can further be improved.

In the embodiment as well, by providing the high-concentration region 100a between the neighboring FETs, isolation is improved, and the alienation distance between the respective FETs can be greatly reduced.

In addition, by providing mask aligning oxide film 120 for forming FETs, it is sufficient to secure 0.1 μm at maximum for a mask misalignment between the gate electrode 69 and source region 56 or drain region 57, and since 0.2 μm had to conventionally be secured, by the difference of 0.1 μm, the distance (d22) between the gate electrode 69 and source region 56 or drain region 57 can be shrunk. In detail, the distances between the source region 56, drain region 57, and gate electrode 69 can be reduced from 0.6 μm to 0.5 μm, and furthermore, for the same reason, the distance from the end of the source region 56 to the end of the source electrode 65 and the distance (d21) from the end of the drain region 57 to the end of the drain electrode 66 can be reduced from 0.4 μm to 0.3 μm.

Namely, mask alignment accuracy of the source region 56, drain region 57, and gate electrode 69 is improved, and the distances between the source region 56, drain region 57, and gate electrode 69 are respectively reduced by 0.1 μm respectively, and mask alignment accuracy between the source region 56 and source electrode 65 and between the drain region 57 and drain electrode 66 is improved, and the distance from the end of the source region 56 to the end of the source electrode 65 and the distance from the end of the drain region 57 to the end of the drain electrode 66 are reduced by 0.1 μm, respectively, and the distance between the source electrode and drain electrode can be reduced by 0.4 μm in total, therefore, improvement in the saturation current value and reduction in the ON resistance value can be realized. By combining this effect with the effect of the aforementioned change from the Ti Schottky gate FET to the Pt buried gate FET, even when the gate width Wg of the FET for switching is reduced to 500 μm, conventional saturation current value and ON resistance value can be secured, thus this greatly contributes to an improvement in isolation by a gate width Wg reduction.

Furthermore, in order to improve FETs in performance as basic elements, the n$^+$-type regions 60 and 61, which had been provided under the electrode pad 70 and wiring 62 by its manufacturing processes, cannot be formed, however, by providing the high-concentration impurity regions 100b in the vicinity of the electrode pad 70 and wiring 62, a predetermined isolation can be secured.

A method for manufacturing the switch circuit device as shown in the second embodiment will be described with reference to FIG. 7 to FIG. 12.

Herein, a description will be given of one electrode pad. For example, when a switch circuit device as shown in FIG. 1 is manufactured by the following manufacturing method, an electrode pad for a common input terminal, electrode pads for first and second control terminals, and electrode pads for first and second output terminals are all similarly formed. Herein, since the high-concentration impurity regions 100a–100c are identical components and arrangements thereof are varied, these will be hereinafter described as high-concentration impurity regions 100.

Figure 7:
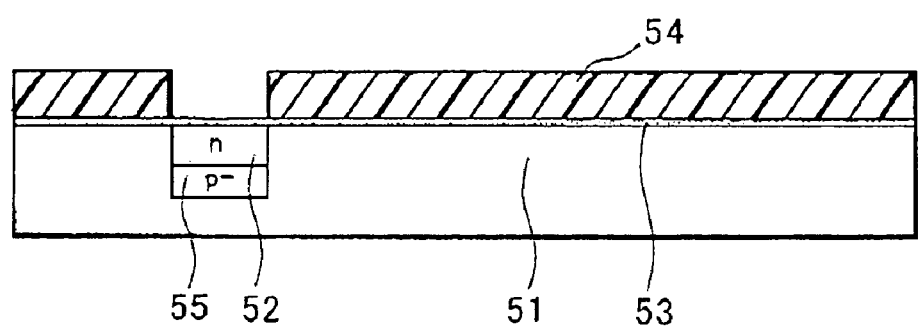
FIGS. 7–12C show process steps of manufacturing the device of FIG. 5.

First step: First, as shown in FIG. 7, an operation layer 52 is formed on the surface of a substrate 51. Namely, the whole surface of a compound semiconductor substrate 51 formed of GaAs or the like is covered with a through ion implanting silicon nitride film 53 having a thickness of approximately 100 Å to 200 Å. Next, GaAs at the outermost or a predetermined region of the chip is etched to form alignment marks (unillustrated), and a photolithography process is performed to selectively open a window in a resist layer 54 on a predetermined operation layer 52. Thereafter, by use of this resist layer 54 as a mask, an ion implantation of impurity (24Mg$^+$) to give a p$^-$-type and an ion implantation of impurity (29Si$^+$) to give an n-type are performed to select an operation layer for the predetermined operation layer 52. As a result, a p$^-$-type region 55 and, thereon, an n-type operation layer 52 are formed in the non-doped substrate 51. Next, an silicon nitride film for annealing is deposited at approximately 500 Å.

Second step: Next, as shown in FIG. 8, source and drain regions 56 and 57 are formed in contact with the operation layer 52, and simultaneously, a high-concentration impurity region 100 is formed in the vicinity of a Schottky metal layer to form a Schottky junction with the substrate.

The resist layer 54 used in the previous step is removed, and a photolithography process is newly performed to selectively open windows in a resist layer 58 in the vicinity of a predetermined source region 56 and drain region 57 and a predetermined Schottky metal layer. Since the Schottky metal layer (also referred to as a gate metal layer) is the gate electrode and the lowermost layers of wiring and electrode pad to form a Schottky junction with a semi-insulating substrate, the vicinity of the part of the predetermined wiring 62 and predetermined electrode pad 70 is exposed.

Subsequently, by use of this resist layer 58 as a mask, an ion implantation of impurity (29Si$^+$) to give an n-type is performed for the substrate surface of the predetermined source region 56 and drain region 57 and the predetermined high-concentration impurity region 100. Thereby, the n$^+$-type source region 56 and drain region 57 are formed, and simultaneously, high-concentration impurity regions 100 are formed. In order to secure a predetermined isolation, the high-concentration impurity regions 100 are provided at least at a region where the gate metal layer is adjacent to other gate metal layers or impurity regions. In addition, the high-concentration impurity regions 100 are provided on the substrate surface alienated by approximately 4 μm from the end part of the gate metal layer. At the outermost periphery of the chip or at a predetermined region of the mask, the resist 58 has been removed for alignment marks for mask alignment in a later step.

Figure 8:
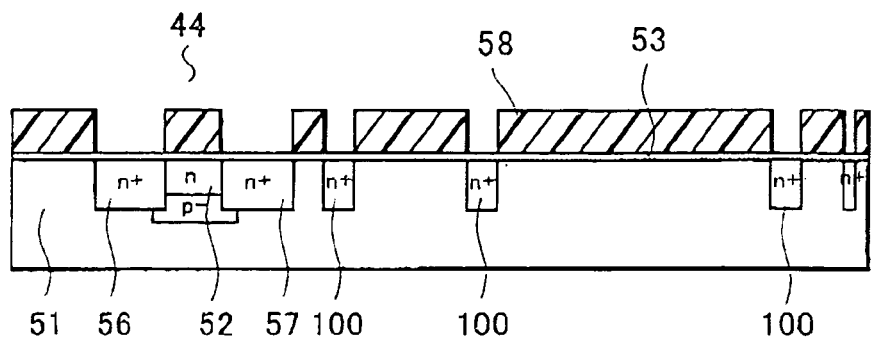

In the sectional view of FIG. 8, shown is a view where high-concentration impurity regions 100 are provided in the vicinity of the FET channel region 44, predetermined wiring 62, and predetermined electrode pad layer 70 so as to separate the same respectively. However, in actuality, as shown in FIG. 5, these are formed in regions where one FET gate electrode 69 is adjacent to another FET (a high-concentration impurity region 100a) or in a vicinity of the gate metal layer in a region (a high-concentration impurity region 100b) where the gate metal layer to be the electrode pad 70 and wiring 62 is at least adjacent to any of the FETs, other electrode pads 70 and wiring 62, and the resistors R1–R4 formed of impurity regions.

When a metal layer to form a Schottky junction (in the embodiment, a gate metal layer) is directly provided on a GaAs substrate, if a depletion layer reaches adjacent other gate metal layers, FETs, and resistors (impurity regions) due to a change in the depletion layer distance according to the high-frequency signals, leakage of the high-frequency signals may occur therein.

However, if the $n^+$-type high-concentration impurity region 100 is provided on the surface of the substrate 51 in the vicinity of the gate metal layer, unlike the surface of the substrate 51 (although this is semi-insulating, the substrate resistance value is $1 \times 10^7$–$1 \times 10^8$ Ω·cm) where no impurity has been doped, the impurity concentration becomes high (ion type is $29Si^+$ and the concentration is $1$–$5 \times 10^{18}$ cm$^{-3}$). Thereby, the gate metal layer and substrate 51 are separated, and no depletion layer extends, therefore, the gate metal layer can be provided and the adjacent other gate metal layers, FETs, and resistors can be provided with a greatly approximated alienation distance from each other.

Figure 9A:
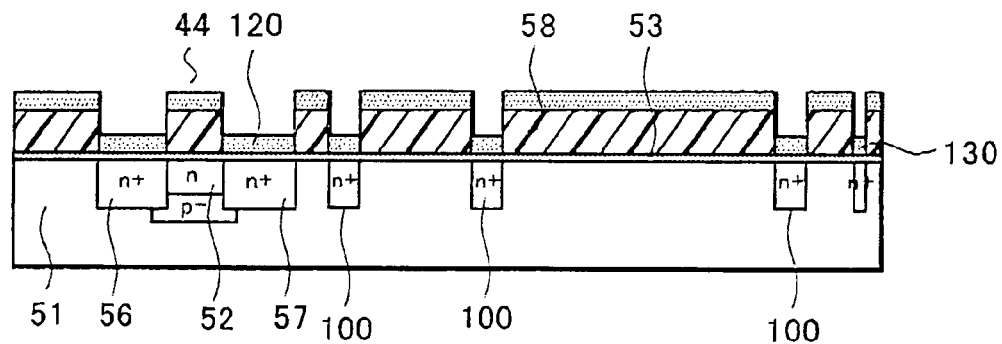
Figure 9B:
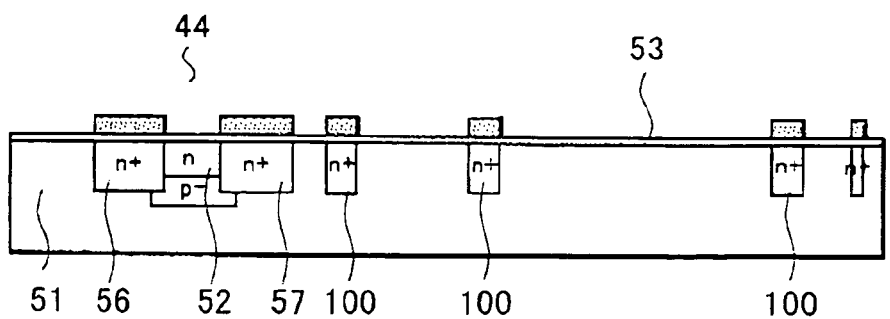

Third step: Next, as shown in FIG. 9, oxide films 120 are formed on the source region 56 and drain region 57 and the high-concentration impurity regions 100. While the resist 58 with which high-concentration impurity regions 100 have been formed remains, oxide films 120 are deposited on the whole surface (FIG. 9A). Thereafter, by removing the resist 58 by lift-off, the oxide films 120 are left on the source region 56 and drain region 57 and the high-concentration impurity regions 100 (FIG. 9B). Oxide films 120 also remain on the part where the resist 54 has been removed for alignment marks, and these oxide films 120 are utilized as alignment marks 130 in the following steps. Next, activation annealing is performed for the ion implanted p⁻-region, n-type operation layer, n⁺-type region of source region, drain region, and high-concentration impurity regions.

Fourth step: Furthermore, as shown in FIG. 10, first source and first drain electrodes 65 and 66 are formed by aligning a mask with the oxide films 120 and adhering an ohmic metal layer 64 as a first-layer electrode to the source and drain regions 56 and 57.

Figure 10A:
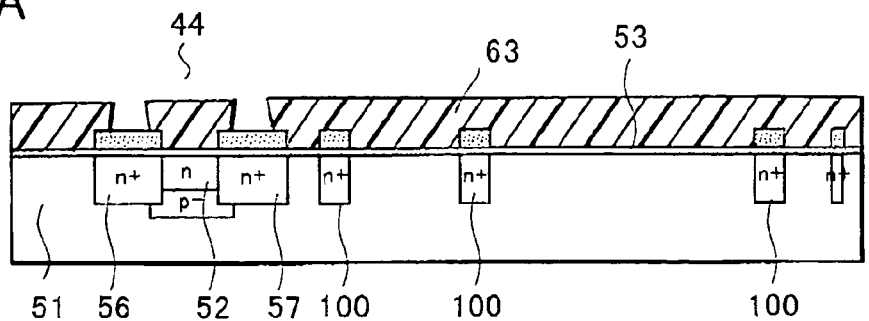
Figure 10B:
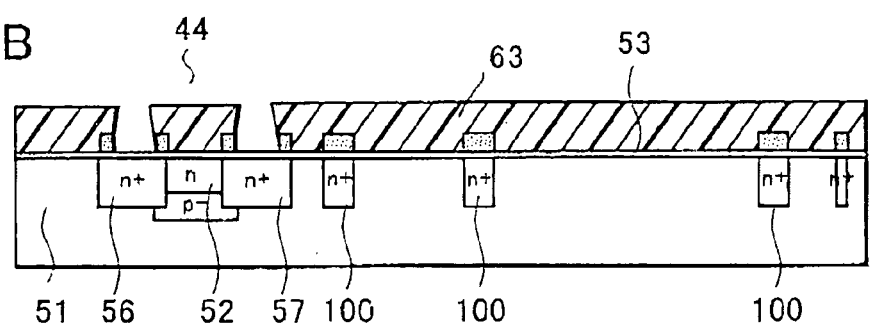
Figure 10C:
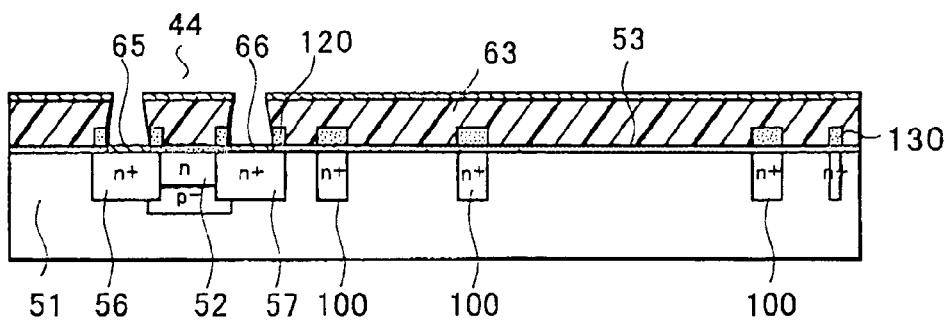
Figure 10D:
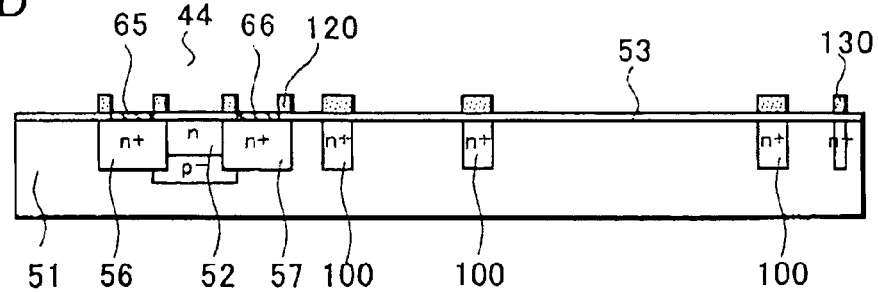

First, a new resist 63 is provided, and a photolithography process is performed to selectively open windows in parts where a predetermined first source electrode 65 and first drain electrode 66 are formed (FIG. 10A). The exposed oxide films 120 and underlying silicon nitride film 53 are removed by CF₄ plasma to expose a source region 56 and a drain region 57 (FIG. 10B), and subsequently, three layers of AuGe/Ni/Au to be an ohmic metal layer 64 are evaporated in order (FIG. 10C). Thereafter, the resist 63 is removed, to leave, by lift-off, the first source electrode 65 and first drain 66 on the source region 56 and drain region 57 in contact. Subsequently, ohmic junctions between the first source electrode 65 and source region 56 and the first drain electrode 66 and drain region 57 are formed by an alloying heat treatment (FIG. 10D).

Priorly, steps for forming the operation layer 52, source and drain regions 56 and 57, source and drain electrodes 65 and 66 have been performed by use of alignment mark of etched GaAs, and aligning accuracy of the mask aligner is 0.1 µm, therefore, a mask alignment error between the source region 56 and source electrode 65 and between the drain region 57 and drain electrode 66 has resulted in an error of 0.2 µm at maximum. Since the distance between the end of the source region 56 and the end of the source electrode 65 and the distance between the end of the drain region 57 and the end of the drain electrode 66 (see d11 of FIG. 3) of 0.2 µm are a limit of the withstand voltage, an alienation distance of 0.4 µm had to be secured as a design center in consideration of misalignment. However, as in the embodiment, since the source region and drain region and the source electrode and drain electrode can be directly mask-aligned by leaving the oxide films 120 on the source region 56 and drain region 57 simultaneously while forming alignment marks 130, the distance between the end of the source region 56 and the end of the source electrode 65 and the distance between the end of the drain region 57 to the end of the drain electrode 66 (see d21 of FIG. 6) can be reduced. That is, since a mask misalignment between the source region 56 and source electrode 65 and between the drain region 57 and drain electrode 66 can be suppressed to 0.1 µm at maximum, it is sufficient to secure an alienation distance of 0.3 µm as a design center.

Figure 11A:
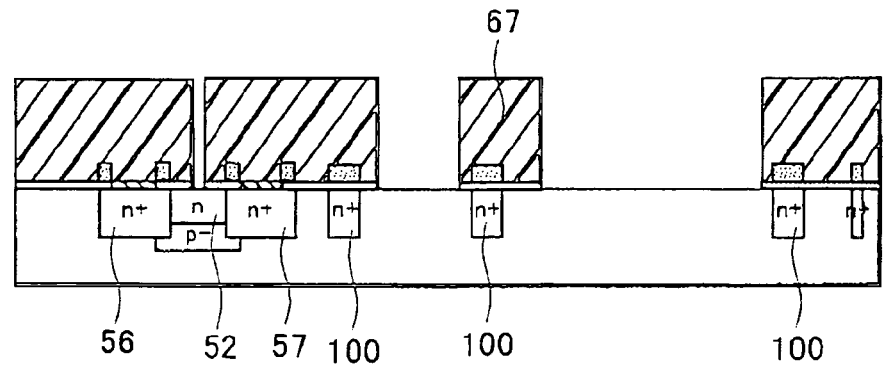

Fifth step: Furthermore, as shown in FIG. 11, a gate electrode 69, a first electrode pad 70, and wiring 62 are formed by aligning a mask with the oxide films 120 and adhering a gate metal layer 68 as a second-layer electrode to the surface of the substrate. First, in FIG. 11A, a photolithography process is performed to selectively open windows at predetermined gate electrode 69, electrode pad 70 and wiring 62 parts. The silicon nitride film 53 exposed through the predetermined gate electrode 69, electrode pad 70, and wiring 62 parts is dry-etched to expose the operation layer 52 in the predetermined gate electrode 69 part and to expose the substrate 51 in the predetermined wiring 62 and predetermined electrode pad 70 parts. An opening part of the predetermined gate electrode 69 part is provided as 0.5 µm so that a miniaturized gate electrode 69 can be formed.

Figure 11B:
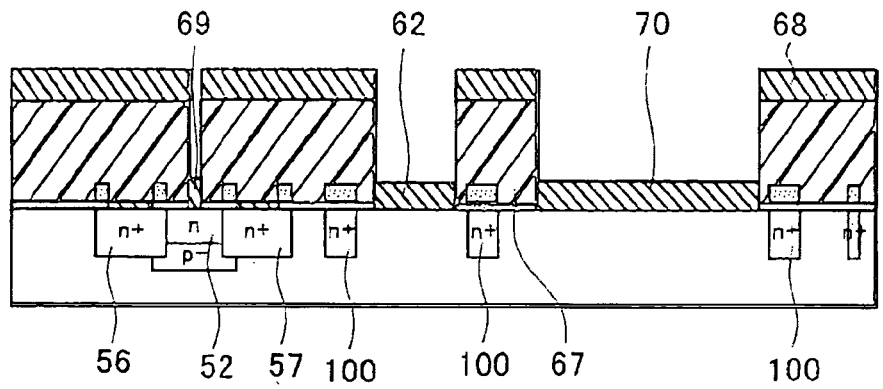

Next, in FIG. 11B, a gate electrode 69, wiring 62, and first electrode pad 70 are formed by adhering a gate metal layer 68 as a second-layer electrode with the operation layer 52 and exposed substrate 51. Namely, five layers of Pt/Mo/Ti/Pt/Au to be a gate metal layer 68 as a second-layer electrode is evaporated in order on the substrate 51.

Figure 11C:
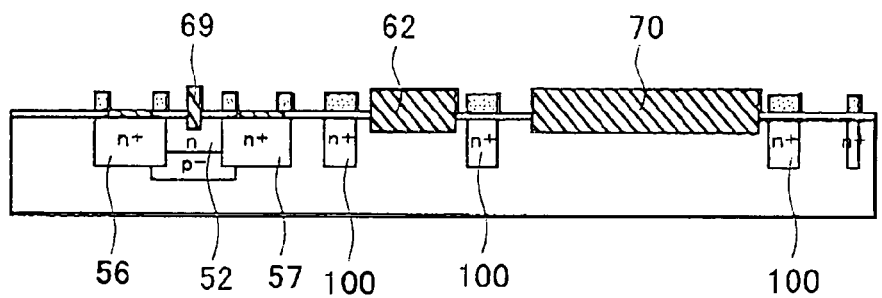

Thereafter, as in FIG. 11C, the resist layer 67 is removed to form, by lift-off, the gate electrode 69 on the operation layer 52 in contact of a gate length of 0.5 µm, first electrode pad 70, and wiring 62, and a heat treatment to bury Pt is applied. Thereby, while the gate electrode 69 maintains a Schottky junction with the substrate, a part thereof is buried in the operation layer 52. Herein, the depth of the operation layer 52 in this case is formed deep in consideration of a to-be-buried part of this gate electrode 69 so that desirable FET characteristics can be obtained.

The surface of the operation layer 52 (for example, approximately 500 Å from the surface) does not allow a current to flow since a natural depletion layer occurs or crystals are uneven in this region, and is therefore not effective as a channel region. By burying a part of the gate electrode 69 into the channel region 52, a part where a current flows immediately under the gate electrode 69 sinks from the surface of the channel region 52. Since the channel region 52 has been formed deep beforehand in consideration of a to-be-buried part of the gate electrode 69 so that desirable FET characteristics are obtained, this region can be effectively utilized as a channel. In detail, there is an advantage such that current density, channel resistance, and high-frequency strain characteristics are greatly improved.

Herein, the mask for forming a gate electrode 69 also uses the alignment marks 130. Namely, the source and drain regions and gate electrode are directly mask-aligned. Thereby, misalignment between the gate electrode 69 and source region 56 or drain region 57 becomes, in short, equivalent to the alignment accuracy of the mask aligner, and can be suppressed to 0.1 μm at maximum. The gate electrode 69 and source region 56 or drain region 57 has been conventionally indirectly mask-aligned via alignment marks provided by separately etching GaAs, therefore, since the alignment accuracy of the mask aligner is 0.1 μm, misalignment between the gate electrode 69 and source region 56 or drain region 57 results in 0.2 μm at maximum. Since a predetermined withstand voltage cannot be secured unless the source region 56 and drain region 57 and the gate electrode 69 are alienated by 0.4 μm at the minimum, it has been necessary to secure an alienation distance of 0.6 μm as a design center in consideration of manufacturing unevenness due to mask alignment error, however, according to the embodiment, it is sufficient to secure 0.5 μm at a design center (see FIG. 3 and FIG. 6).

Herein, the oxide films 120 are also formed on the high-concentration impurity regions 100 formed simultaneously with the source region 56 and drain region 57. Namely, if high-concentration impurity regions 100 to improve isolation are formed on the whole surface (or the peripheral part) under the electrode pad 70 or wiring 62, gate metal layers 68 are deposited on the oxide films 120. In particular, since FET basic performance is improved by the embodiment, the gate electrode 69 is formed by burying Pt. Namely, although Pt is to be arranged on the oxide films 120, the oxide films 120 and Pt have weak adhering strength, therefore, a problem of peeling of the gate metal layer 68 from the oxide film 120 occurs.

Therefore, as in FIG. 5 and FIG. 11C, without being brought into contact with the electrode pad 70 or wiring 62, the high-concentration impurity region 100 is arranged between the gate metal layer and adjacent other gate metal layers, FETs, or impurity regions. Thereby, a depletion layer that expands from the gate metal layer to the substrate is prevented from reaching the adjacent other gate metal layer, FET, or impurity region.

Namely, this is a manufacturing method which can improve the basic performance as FETs, and moreover, expansion of the depletion layer from the gate metal layer to construct the electrode pad 70 and wiring 62 can be suppressed by the high-concentration impurity region 100 provided in the vicinity, thus a leakage of high-frequency signals can be prevented.

Seventh step: Furthermore, second source and drain electrodes 75 and 76 and a second electrode pad 77 are formed by adhering a pad metal layer 74 as a third-layer electrode onto the first source and first drain electrodes 65 and 66 and the first electrode pad 70.

Figure 12A:
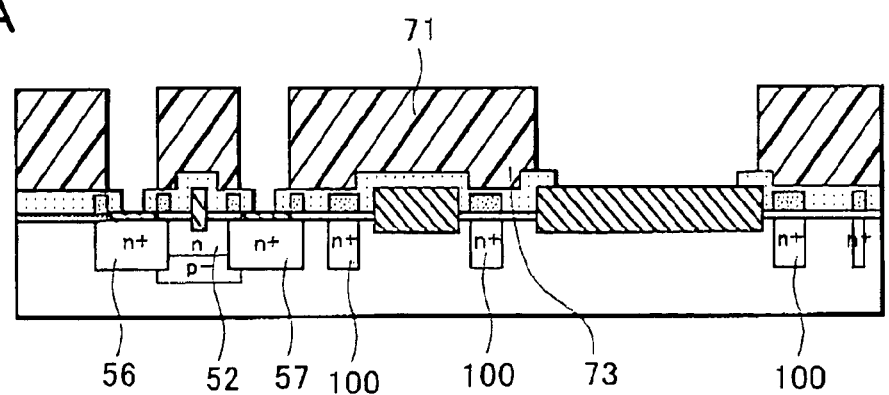

After forming the gate electrode 69, wiring 62, and first electrode pad 70, in order to protect the operation layer 52 around the gate electrode 69, the surface of the substrate 51 is covered with a passivation film 72 of a silicon nitride film. A photolithography process is performed on this passivation film 72 to selectively open windows in the resist at contact parts with the first source electrode 65, first drain electrode 66, gate electrode 69, and first electrode pad 70, and the passivation film 72 at these parts is dry-etched. Thereafter, the resist layer 71 is removed (FIG. 12A).

Figure 12B:
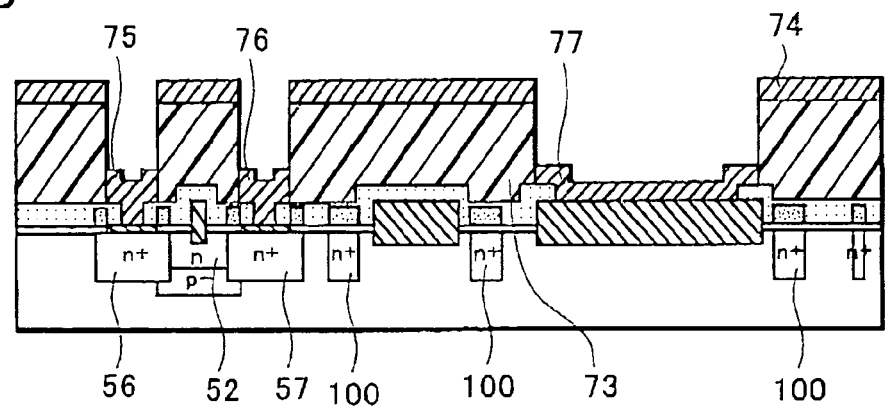
Figure 12C:
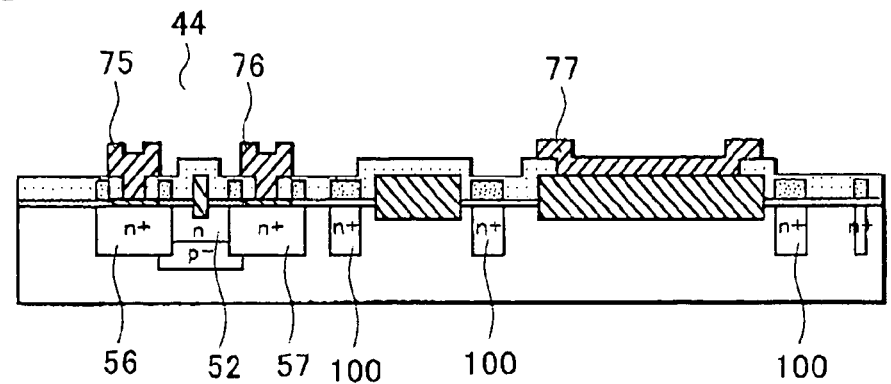
Figure 13A:
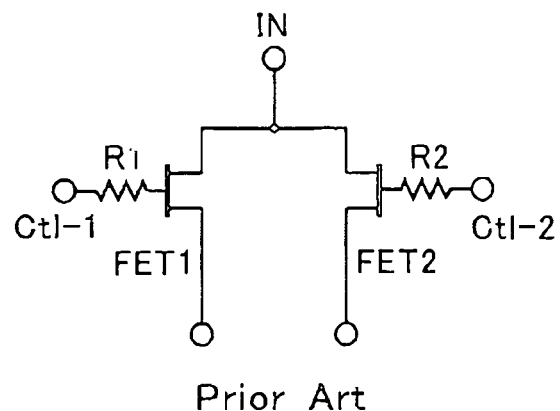
FIG. 13A is a circuit diagram and FIG. 13B is a plan view of a conventional device.
Figure 13B:
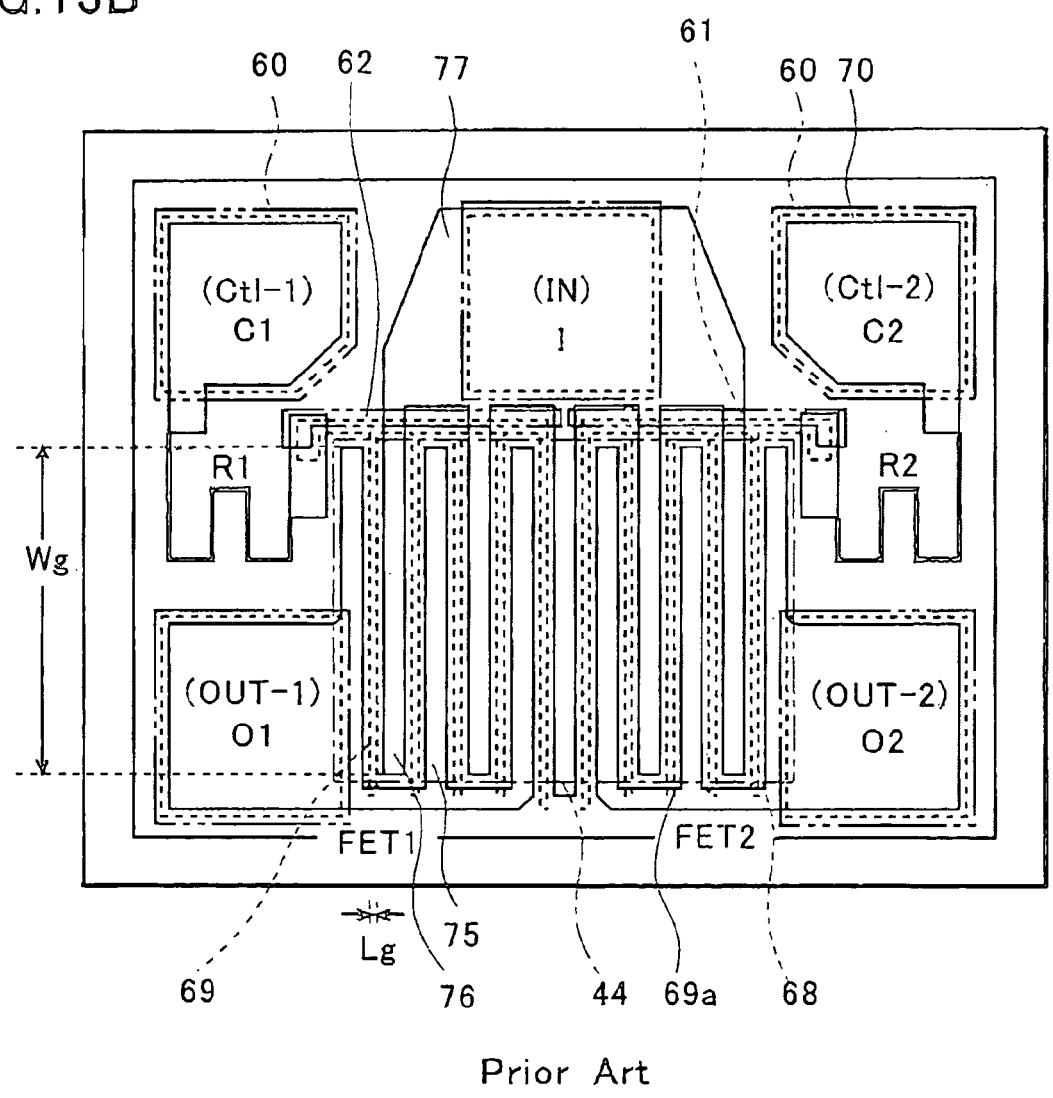
Figure 14A:
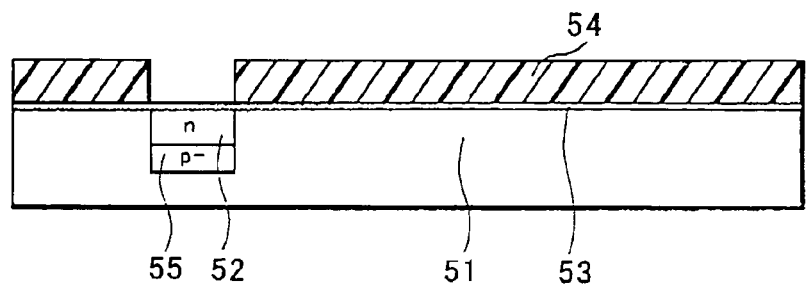
FIGS. 14–17C show process steps of manufacturing a conventional device.
Figure 14B:
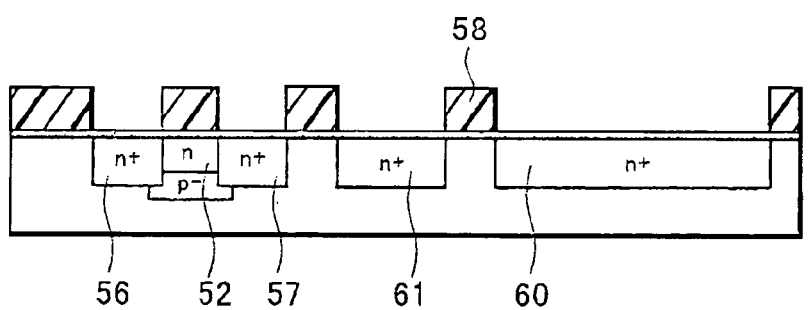
Figure 15:
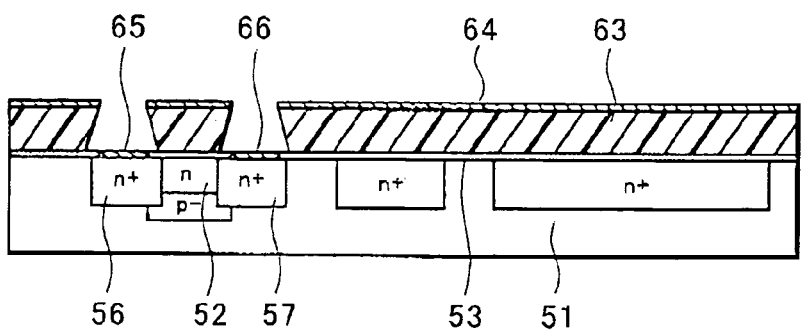
Figure 16A:
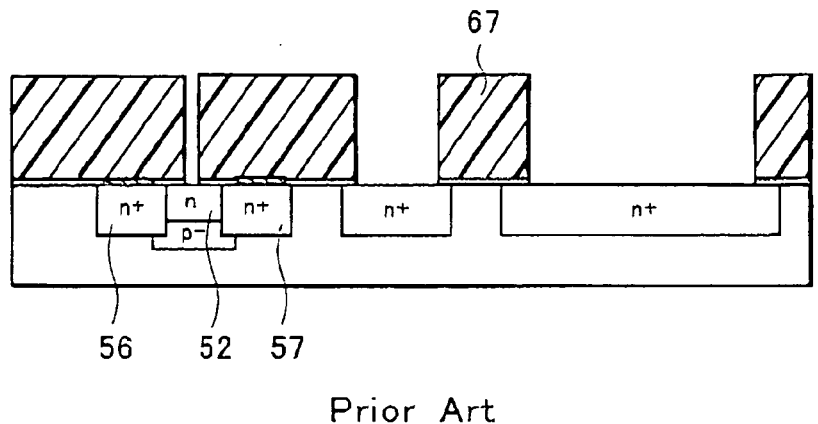
Figure 16B:
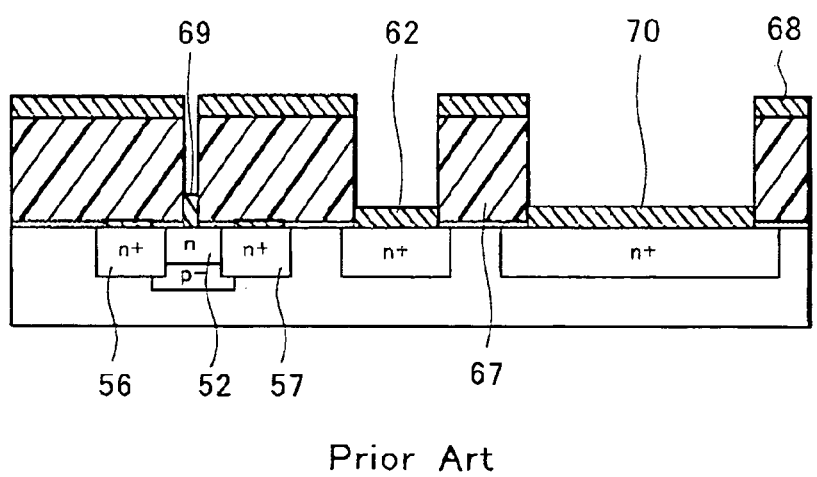
Figure 16C:
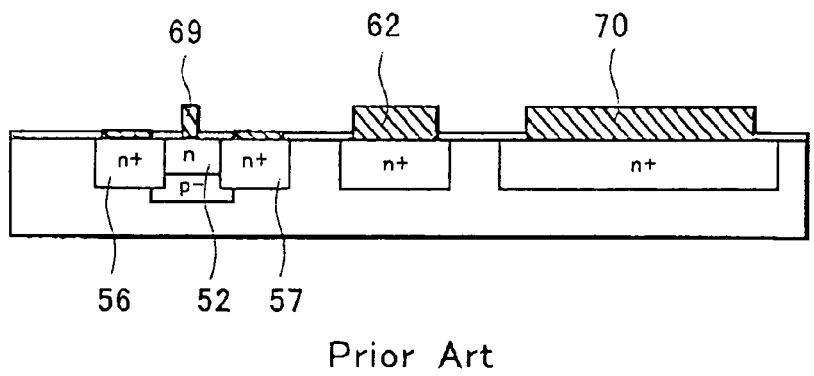
Figure 17A:
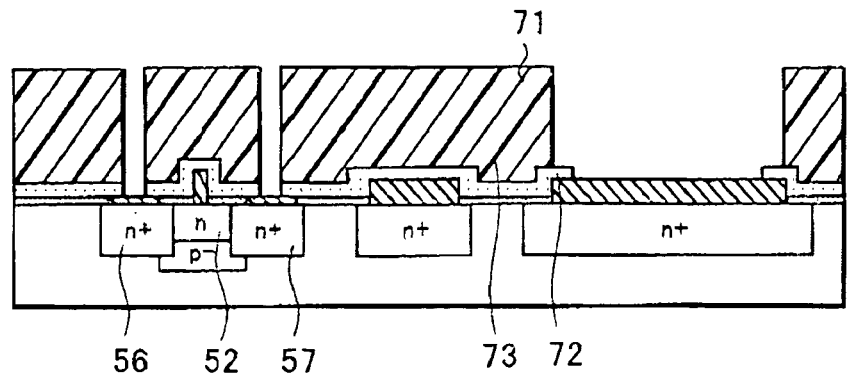
Figure 17B:
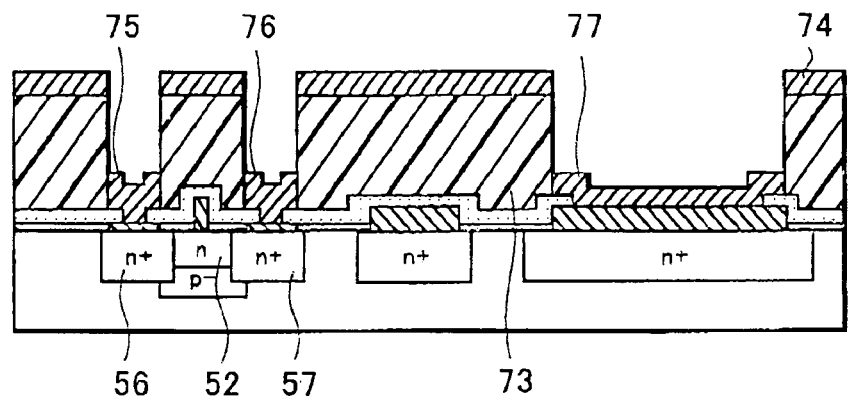
Figure 17C:
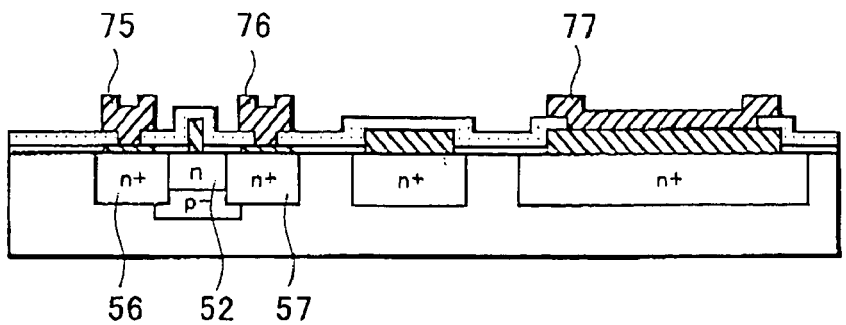
Figure 18:
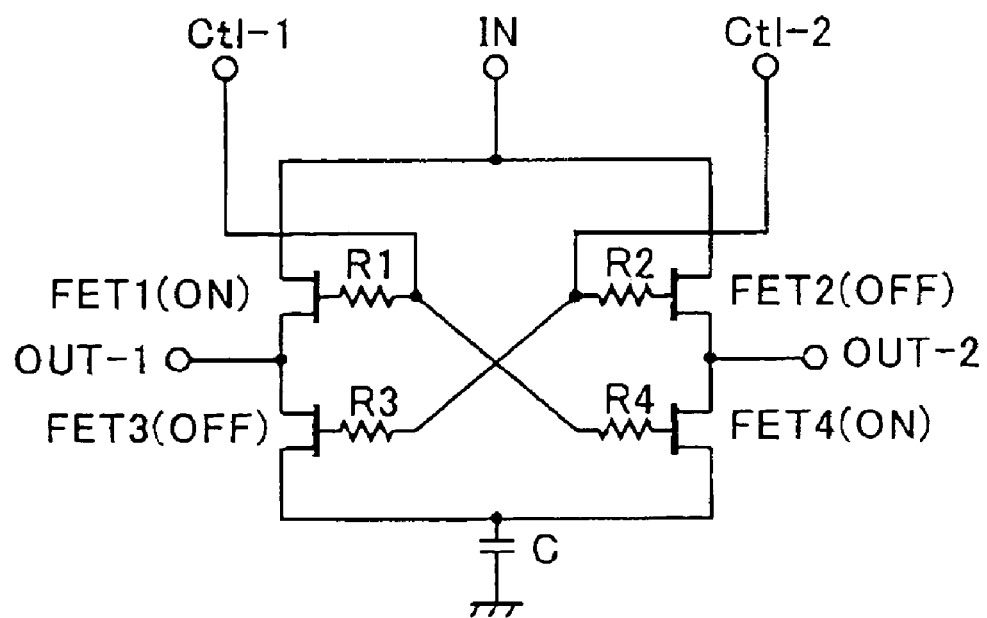
FIG. 18 is a circuit diagram of a conventional device.
Figure 19:
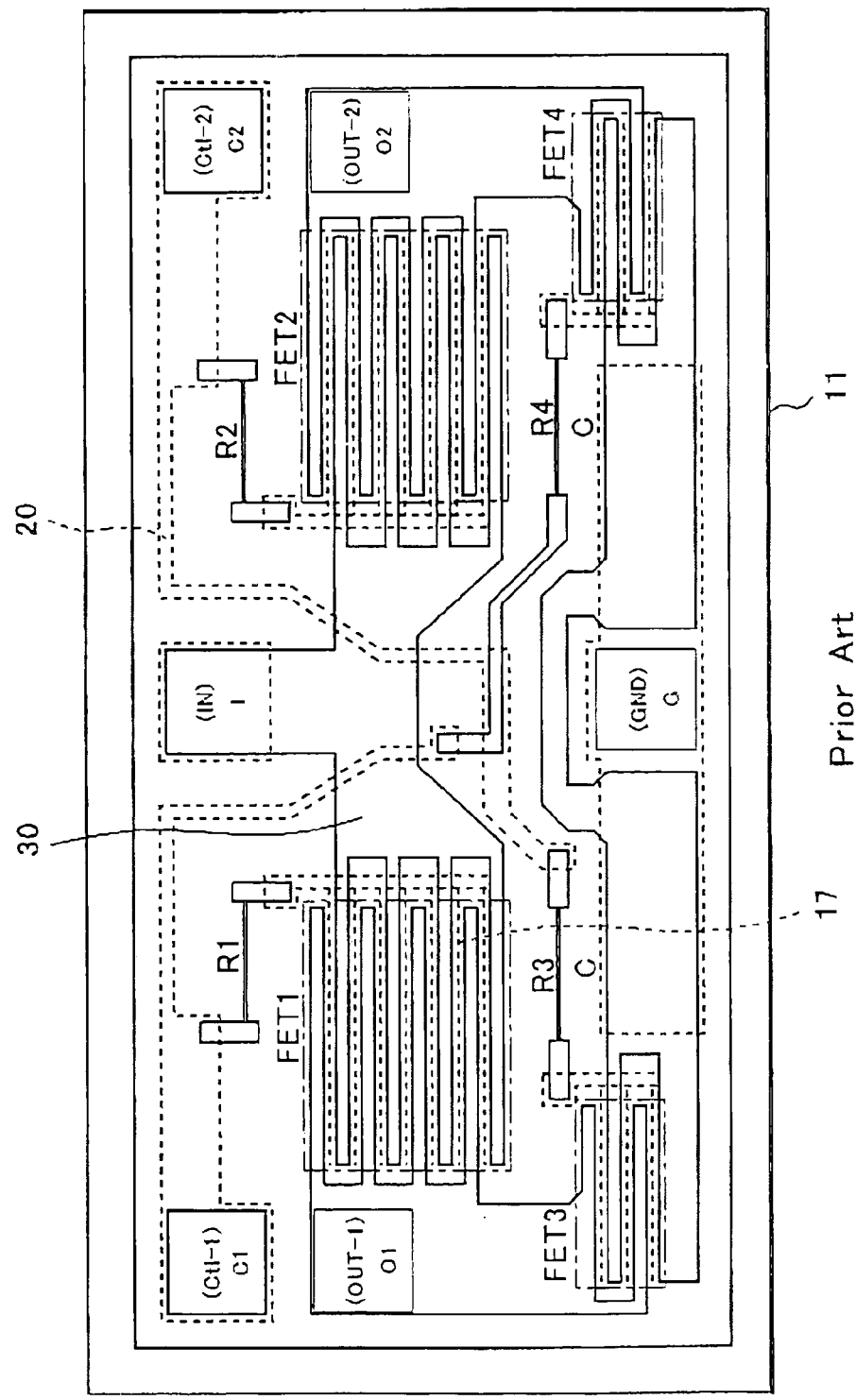
FIG. 19 is a plan view of a conventional device.

Furthermore, a new resist layer 73 is applied to the whole surface of the substrate 51, and a photolithography process is performed to selectively open windows in the resist on the predetermined second source electrode 75 and second drain electrode 76 and the second electrode pad 77. Subsequently, three layers of Ti/Pt/Au to be a pad metal layer 74 as a third-layer electrode are evaporated in order, whereby a second source electrode 75, a second drain electrode 76, and a second electrode pad 77 which is in contact with the first source electrode 65, first drain electrode 66, and first electrode pad 70 are formed (FIG. 12B). Since the other parts of the pad metal layer 74 are adhered onto the resist layer 73, the resist layer 73 is removed to remain, by lift-off, only the second source electrode 75, second drain electrode 76, and second electrode pad 77, while the other parts are removed. Herein, since some wiring parts are formed by use of this pad metal layer 74, as a matter of course, the pad metal layer 74 of these wiring parts is left (FIG. 12C).

Those processing steps described above are merely examples, and any processing step can be employed as long as high-frequency signals to be applied to the electrode pad 70 are prevented from being transmitted to the wiring 62 via the substrate 51.

As above, description has been focused on embodiments where the gate electrode 69 forms a Schottky junction on a channel region (operation layer 52) and is extended from the channel region and forms a Schottky junction with the surface of the compound semiconductor substrate, or embodiments where the gate electrode layer 68 forms a Schottky junction on a compound semiconductor substrate. However, the embodiment is not limited hereto and similar effects can be obtained in a case where a semiconductor substrate and a metal layer forms a Schottky junction and also in, for example, embodiments where an insulating layer provided on a silicon semiconductor substrate and a metal layer form a Schottky junction. In the case of a semiconductor substrate, any substrate can be employed as long as the impurity concentration is $1\times10^{14}$ cm$^{-3}$ or less and the resistivity is $1\times10^{6}$ Ω·cm or more, and in a case of an insulating layer formed by ion implanting into a semiconductor substrate, the resistivity of the insulated layer is $1\times10^{3}$ Ω·cm or more.

As has been described in detail in the above, according to the embodiment of the invention, the following effects can be obtained:

By providing a high-concentration impurity region between the gate electrode and adjacent FET, isolation can be improved. By the conventional method wherein a n$^{+}$-type region is provided under a gate metal layer, it cannot be provided under a front part of the comb-like gate electrode protruding from a channel region opposite to a bound side thereof. However, according to the embodiments, by arranging a high-concentration impurity region at a part, in the vicinity of the gate electrode, at least adjacent to another FET, gate metal layer, and impurity region, leakage of high-frequency signals caused by a depletion layer expanding in the substrate can be prevented.

In addition, by providing a high-concentration impurity region in the vicinity of a pad and wiring to be a gate metal layer, expansion of a depletion layer from the pad and wiring can also be suppressed.

Furthermore, by directly mask-aligning n$^{+}$-type regions as a source region and a drain region and a gate mask, an alignment error between the n$^{+}$-regions and gate results in 0.1 μm at maximum. Namely, even when manufacturing unevenness due to the mask alignment error is taken into consideration, the distance between the n$^+$-type regions and gate electrode can be reduced from 0.6 µm to 0.5 µm, and accordingly, the saturation current value can be increased and the ON resistance value can be decreased. The distance between the n$^+$-type region end and the end of the ohmic electrode (source electrode or drain electrode) can also be reduced in the design value from 0.4 µm to 0.3 µm for a completely identical reason, and accordingly, the saturation current value of the FET can be increased and the ON resistance value can be decreased.

In addition, since the FET basic performance can further be improved by burying the gate electrode metal into the channel in addition to the above, the gate width Wg can be made 500 µm with characteristics equivalent to those of the prior art, and there also exists an advantage in an improvement in isolation by a capacity reduction.

When an alignment mark forming step is carried out subsequent to a step for forming source and drain regions and high-concentration impurity regions, oxide films remain on the n$^+$-regions, therefore, if wiring and electrodes pads, which are provided simultaneously with a gate electrode, are provided on the n$^+$-regions as in the prior art, in a case of a Pt buried gate, adhering strength between the undermost layer Pt of the wiring and electrode pads and oxide films on the n$^+$-regions may be weakened. However, in the present embodiment, since the pad and wiring are not brought into contact with the high-concentration impurity region but are arranged in the vicinity thereof, the problem of weakened adhering strength does not occur and expansion of a depletion layer can be suppressed.

What is claimed is:

1. A semiconductor device comprising:
   a plurality of metal layers, at least one of the metal layers forming a Schottky junction with part of a semi-insulating substrate or part of an insulating layer on a substrate, the part of the semi-insulating substrate forming the Schottky junction with the one of the metal layers comprising no impurity region, the semi-insulating substrate and the insulating layer being made of a compound semiconductor;
   an impurity diffusion region; and
   a high-concentration impurity region formed between two of the metal layers or between one of the metal layers and the impurity diffusion region so as to suppress expansion of a depletion layer from the corresponding metal layer.

2. A semiconductor device comprising:
   a plurality of field effect transistors, each of the transistors comprising a channel region, a source and a drain electrodes which form an ohmic junction with the channel region and a gate electrode forming a Schottky junction with the channel region and forming a Schottky junction with part of a semi-insulating substrate or part of an insulating layer, the part of the semi-insulating substrate forming the Schottky junction with the gate electrode comprising no impurity region, the semi-insulating substrate and the insulating layer being made of a compound semiconductor; and
   a high-concentration impurity region formed between a gate electrode of one of the transistors and another of the transistors so as to suppress expansion of a depletion layer from the gate electrode.

3. The semiconductor device of claim 2, wherein the two transistors having the high-concentration impurity region located therebetween are arranged so that a distance between the two transistors is minimized and a predetermined isolation is maintained.

4. A semiconductor device comprising:
   a plurality of field effect transistors, each of the transistors comprising a channel region, a source and a drain electrodes which form an ohmic junction with the channel region and a gate electrode forming a Schottky junction with the channel region and forming a Schottky junction with part of a semi-insulating substrate or part of an insulating layer on a substrate, the part of the semi-insulating substrate forming the Schottky junction with the gate electrode comprising no impurity region, the semi-insulating substrate and the insulating layer being made of a compound semiconductor;
   a metal layer forming a Schottky junction with another part of the semi-insulating substrate or another part of the insulating layer and comprising an electrode pad and a metal wiring layer, the another part of the semi-insulating substrate forming the Schottky junction with the metal layer comprising no impurity region;
   an impurity diffusion region connecting the transistors and the metal wiring layer; and
   a high-concentration impurity region formed between a gate electrode of one of the transistors and the metal layer or between the gate electrode and the impurity diffusion region so as to suppress expansion of a depletion layer from the gate electrode.

5. The semiconductor device of claim 4, wherein the gate electrode is positioned from the metal layer or the impurity diffusion region so that a distance between the gate electrode and the corresponding portion of the metal layer or the corresponding portion of the impurity diffusion region is minimized and a predetermined isolation is maintained.

6. A semiconductor device comprising:
   a plurality of field effect transistors, each of the transistors comprising a channel region, a source and a drain electrodes which form an ohmic junction with the channel region and a gate electrode forming a Schottky junction with the channel region and forming a Schottky junction with part of a semi-insulating substrate or part of an insulating layer on a substrate, the part of the semi-insulating substrate forming the Schottky junction with the gate electrode comprising no impurity region, the semi-insulating substrate and the insulating layer being made of a compound semiconductor;
   a plurality of metal layers, at least one of the metal layers forming a Schottky junction with another part of the semi-insulating substrate or another part of the insulating layer and comprising an electrode pad and a metal wiring layer, the another part of the semi-insulating substrate forming the Schottky junction with the one of the metal layers comprising no impurity region;
   an impurity diffusion region connecting the transistors and the metal wiring layer; and
   a high-concentration impurity region formed between one of the metal layers and one of the transistors, between two of the metal layers or between one of the metal layers and the impurity diffusion region so as to suppress expansion of a depletion layer from the metal layer.

7. The semiconductor device of claim 6, wherein a distance between one of the metal layers and one of the transistors, between two of the metal layers or between one of the metal layers and the impurity diffusion region is a minimum distance that assures a predetermined isolation.

8. The semiconductor device of claim 2, 4 or 6, further comprising a first insulating film formed along edges of the source and drain electrodes and a second insulating film covering the first insulating film.

9. The semiconductor device of claim 8, wherein a lateral edge of the first insulating film is substantially located at a lateral edge of the source or drain region and another lateral edge is substantially located at a lateral edge of the corresponding source or drain electrode.

10. The semiconductor device of claim 1, 2, 4 or 6, wherein the insulating layer is formed by ion implantation in the substrate, the Schottky junction being formed in the insulating layer.

11. The semiconductor device of claim 1, 2, 4 or 6, wherein a resistivity of the insulating layer is $1\times10^3 \Omega \cdot cm$ or higher.

12. The semiconductor device of claim 1, 2, 4 or 6, wherein an impurity concentration of the semi-insulating substrate is $1\times10^{14}$ cm$^3$ or lower.

13. The semiconductor device of claim 1, 2, 4 or 6, wherein a resistivity of the insulating layer is $1\times10^6 \Omega \cdot cm$ or higher.

14. The semiconductor device of claim 1, 2, 4, or 6, wherein an impurity concentration of the high-concentration impurity region is $1\times10^{17}$ cm$^{-3}$ or higher.

15. The semiconductor device of claim 1, 2, 4 or 6, further comprising an electrode pad of a DC potential, GND potential or high-frequency GND potential, wherein the high-concentration impurity region is connected to the electrode pad.

16. The semiconductor device of claim 15, further comprising a metal electrode that is in ohmic connection with the high-concentration impurity region, wherein the metal electrode is connected to an electrode pad of a DC potential, GND potential or high-frequency GND potential.

17. The semiconductor device of claim 15, further comprising a metal electrode that is at least partially in Schottky connection with the high-concentration impurity region, wherein the metal electrode is connected to an electrode pad of a DC potential, GND potential or high-frequency GND potential.

18. The semiconductor device of claim 15, further comprising a metal electrode that is connected to the high-concentration impurity region through the semi-insulating substrate or the insulating layer, wherein the metal electrode forms a Schottky junction with the semi-insulating substrate or the insulating layer and is connected to an electrode pad of a DC potential, GND potential or high-frequency GND potential.

19. The semiconductor device of claim 18, wherein a distance between the high-concentration impurity region and the metal electrode is 0 μm–10 μm.

20. The semiconductor device of claim 15, further comprising a metal electrode contained in the high-concentration impurity region, wherein the metal electrode is part of a bonding pad to which a DC potential, GND potential or high-frequency GND potential is applied.

* * * * *